US012040395B2

(12) United States Patent
Nidhi et al.

(10) Patent No.: US 12,040,395 B2
(45) Date of Patent: Jul. 16, 2024

(54) HIGH VOLTAGE EXTENDED-DRAIN MOS (EDMOS) NANOWIRE TRANSISTORS

(71) Applicant: Intel Corporation, Santa Clara, CA (US)

(72) Inventors: Nidhi Nidhi, Hillsboro, OR (US); Rahul Ramaswamy, Portland, OR (US); Walid M. Hafez, Portland, OR (US); Hsu-Yu Chang, Hillsboro, OR (US); Ting Chang, Portland, OR (US); Babak Fallahazad, Portland, OR (US); Tanuj Trivedi, Hillsboro, OR (US); Jeong Dong Kim, Scappoose, OR (US)

(73) Assignee: Intel Corporation, Santa Clara, CA (US)

(*) Notice: Subject to any disclaimer, the term of this patent is extended or adjusted under 35 U.S.C. 154(b) by 1005 days.

(21) Appl. No.: 16/713,648

(22) Filed: Dec. 13, 2019

(65) Prior Publication Data
US 2021/0184032 A1 Jun. 17, 2021

(51) Int. Cl.
*H01L 29/78* (2006.01)
*H01L 29/08* (2006.01)
*H01L 29/423* (2006.01)
*H01L 29/66* (2006.01)
*H01L 29/786* (2006.01)

(52) U.S. Cl.
CPC ...... *H01L 29/7816* (2013.01); *H01L 29/0873* (2013.01); *H01L 29/0878* (2013.01); *H01L 29/42392* (2013.01); *H01L 29/66545* (2013.01); *H01L 29/66704* (2013.01); *H01L 29/66795* (2013.01); *H01L 29/785* (2013.01); *H01L 29/78645* (2013.01); *H01L 29/78696* (2013.01)

(58) Field of Classification Search
CPC .......... H01L 29/7816; H01L 29/66681; H01L 29/66689; H01L 29/0873; H01L 29/0886; H01L 29/78696; H01L 29/42392; H01L 29/66795; H01L 29/785; H01L 29/0673; H01L 29/775
See application file for complete search history.

(56) References Cited

U.S. PATENT DOCUMENTS

| 2005/0156234 A1* | 7/2005 | Gammel | H01L 29/402 257/E29.112 |
| 2013/0062692 A1* | 3/2013 | Chen | H01L 29/0653 257/E29.256 |
| 2016/0093730 A1* | 3/2016 | Li | H01L 29/66636 438/283 |
| 2017/0092726 A1* | 3/2017 | Nidhi | H01L 29/66659 |
| 2019/0081152 A1* | 3/2019 | Suh | H01L 29/66545 |

* cited by examiner

*Primary Examiner* — Tuan A Hoang
(74) *Attorney, Agent, or Firm* — Schwabe, Williamson & Wyatt, P.C.

(57) ABSTRACT

Embodiments disclosed herein include semiconductor devices and methods of forming such devices. In an embodiment a semiconductor device comprises a substrate, a source region over the substrate, a drain region over the substrate, and a semiconductor body extending from the source region to the drain region. In an embodiment, the semiconductor body has a first region with a first conductivity type and a second region with a second conductivity type. In an embodiment, the semiconductor device further comprises a gate structure over the first region of the semiconductor body, where the gate structure is closer to the source region than the drain region.

21 Claims, 20 Drawing Sheets

HIGH VOLTAGE EXTENDED-DRAIN MOS (EDMOS) NANOWIRE TRANSISTORS

TECHNICAL FIELD

Embodiments of the present disclosure relate to semiconductor devices, and more particularly to extended-drain MOS (EDMOS) nanowire transistors.

BACKGROUND

As integrated device manufacturers continue to shrink the feature sizes of transistor devices to achieve greater circuit density and higher performance, there is a need to manage transistor drive currents while reducing short-channel effects, parasitic capacitance, and off-state leakage in next-generation devices. Non-planar transistors, such as fin and nanowire-based devices, enable improved control of short channel effects. For example, in nanowire-based transistors the gate stack wraps around the full perimeter of the nanowire, enabling fuller depletion in the channel region, and reducing short-channel effects due to steeper sub-threshold current swing (SS) and smaller drain induced barrier lowering (DIBL).

Typically, transistors within a single die are optimized for different performance metrics. For example, low-voltage transistors are used for logic applications, and high-voltage transistors are used for power applications. For fin-based devices, the high-voltage transistors are implemented by growing a thicker gate dielectric compared to the gate dielectric of the low-voltage devices. However, increases to the thickness of the gate dielectric in nanowire and nanoribbon devices are limited. This is because the spacing between the nanowires or nanoribbons needs to be preserved to allow for the gate electrode to wrap entirely around each nanowire or nanoribbon. Furthermore, increasing the wire to wire spacing or ribbon to ribbon spacing is not always practical, since the wire to wire spacing or the ribbon to ribbon is set for optimization of logic devices.

EMBODIMENTS OF THE PRESENT DISCLOSURE

Figure 1A:
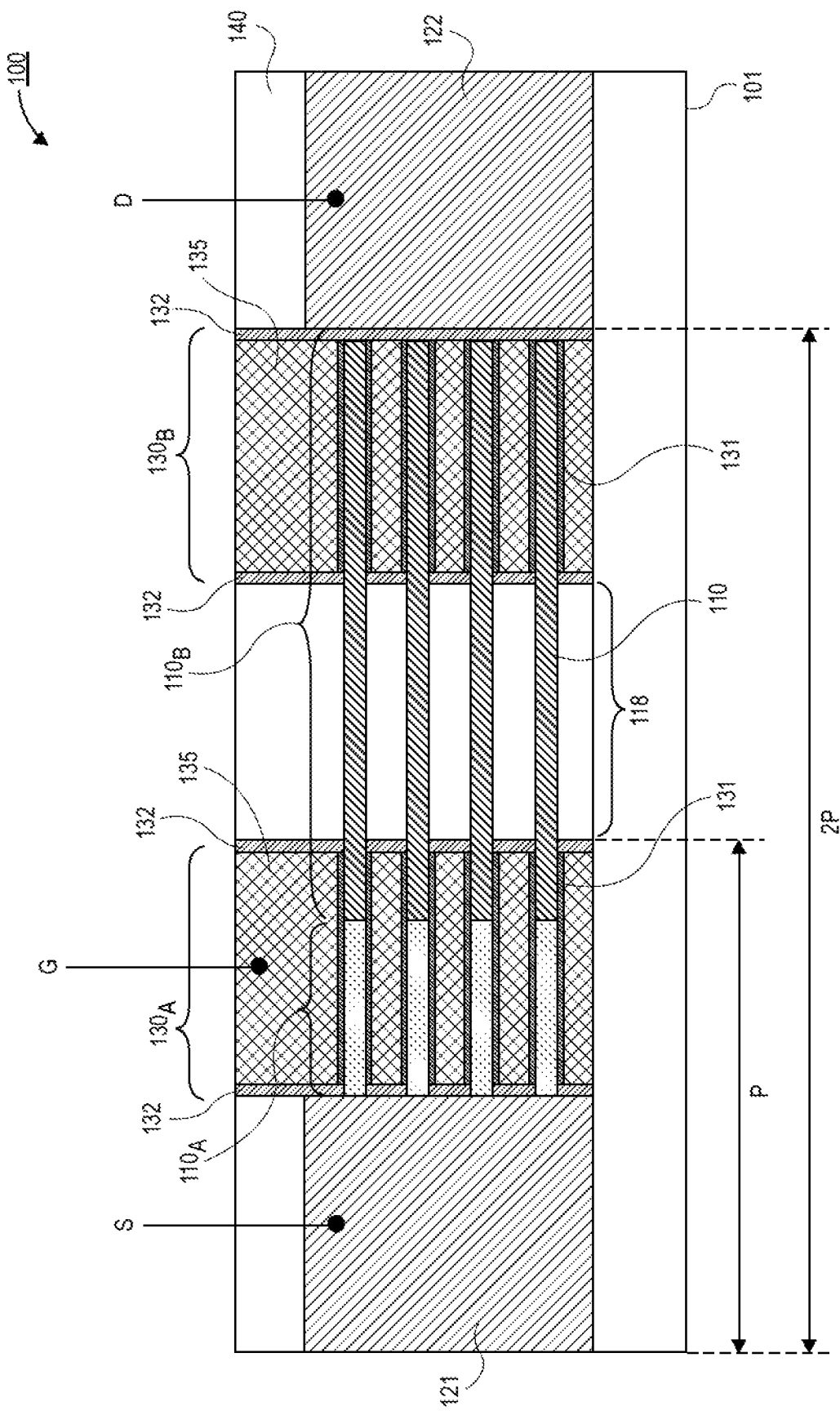
FIG. 1A is a cross-sectional illustration of a nanoribbon transistor that comprises an extended drain region with a dummy electrode, in accordance with an embodiment.

Described herein are extended-drain MOS (EDMOS) nanowire transistors, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Nanoribbon devices are described in greater detail below. However, it is to be appreciated that substantially similar devices may be formed with nanowire channels. A nanowire device may include devices where the channel has a width dimension and a thickness dimension that are substantially similar, whereas a nanoribbon device may include a channel that has a width dimension that is substantially larger or substantially smaller than a thickness dimension. As used herein, "high-voltage" may refer to voltages of approximately 1.0V or higher.

As noted above, high-voltage nanoribbon devices are currently difficult to implement due to limitations imposed by ribbon to ribbon spacing of the channels. Accordingly, embodiments disclosed herein include nanoribbon transistors with extended drain regions. The drain extension provides a length of the nanoribbon over which voltage can be dropped. In order to reduce the added resistance of a drain extension region between the drain and the channel, the drain extension region may be doped. The dopant concentration and the length of the drain extension region can be controlled to provide a desired voltage drop that is balanced against a corresponding increase in resistance.

In an embodiment, the nanoribbon transistors may maintain a standard pitch alignment. That is, the source, drain, and gate may be populated at pitch spacings that are standard for other transistors on the substrate. In such instances, the drain extension region may occupy a depopulated source/drain area. A dummy gate structure may also be included along the length of the drain extension region in some embodiments. Since the high-voltage nanoribbon transistors are pitch aligned, such high-voltage nanoribbon transistors may be fabricated in parallel with standard low-voltage nanoribbon transistors.

In other embodiments, the extended drain region of a high-voltage nanoribbon transistor is not defined by the pitch of the other devices. In such embodiments, the extended drain region may be any desired length. The non-standard length may also allow for the dummy gate electrode to be omitted in some embodiments. Furthermore, in such embodiments, the growth of the drain region may be unconfined. As such, the drain region may comprise a main body and a plurality of protrusions that extend towards the source region. The unconfined epitaxial growth may also result in a dummy drain region in some embodiments.

Referring now to FIG. 1A, a cross-sectional illustration of a high-voltage nanoribbon transistor 100 is shown, in accordance with an embodiment. In an embodiment, the nanoribbon transistor 100 is disposed over a substrate 101. The underlying semiconductor substrate 101 represents a general workpiece object used to manufacture integrated circuits. The semiconductor substrate 101 often includes a wafer or other piece of silicon or another semiconductor material. Suitable semiconductor substrates 101 include, but are not limited to, single crystal silicon, polycrystalline silicon and silicon on insulator (SOI), as well as similar substrates formed of other semiconductor materials, such as substrates including germanium, carbon, or group III-V materials.

In an embodiment, the nanoribbon transistor 100 comprises a plurality of vertically stacked semiconductor bodies 110. The semiconductor bodies 110 may be nanoribbons or nanowires. For simplicity, the semiconductor bodies 110 will be referred to as nanoribbons 110. In an embodiment, the nanoribbons 110 may be any suitable semiconductor material, such as, but not limited to, silicon, germanium, SiGe, GaAs, InSb, GaP, GaSb, InAlAs, InGaAs, GaSbP, GaAsSb, and InP.

In an embodiment, the nanoribbons 110 may comprise first regions $110_A$ and second regions $110_B$. The first regions $110_A$ may be a first conductivity type and the second regions $110_B$ may be a second conductivity type. For example, the first regions $110_A$ may be P-type and the second regions $110_B$ may be N-type.

In an embodiment, the first regions $110_A$ may have a first length that is less than a second length of the second regions $110_B$. In an embodiment, the second regions $110_B$ may be referred to as the extended drain region. As such, the second regions $110_B$ may have the same conductivity type as the drain region 122. The second regions $110_B$ may have a different dopant concentration than the drain region 122. For example, a lower dopant concentration increases the resistance along the second regions $110_B$ and allows for more voltage to be dropped across the second regions $110_B$. Dropping voltage across the second regions $110_B$ allows for a higher gate-to-drain voltage without needing to increase the thickness of the gate dielectric 131. In an embodiment, the dopant concentration of the drain region 122 may be approximately $10^{19}$ cm$^{-3}$ or greater and the dopant concentration of the second regions $110_B$ may be approximately $10^{19}$ cm$^{-3}$ or lower. In a particular embodiment, the dopant concentration of the second regions $110_B$ may be between approximately $10^{17}$ cm$^{-3}$ and approximately $10^{18}$ cm$^{-3}$.

In an embodiment, the nanoribbons 110 extend between a source region 121 and the drain region 122. In an embodiment, the source/drain regions 121/122 may comprise an epitaxially grown semiconductor material. The source/drain regions 121/122 may comprise a silicon alloy. In some implementations, the source/drain regions 121/122 comprise a silicon alloy that may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. In other embodiments, the source/drain regions 121/122 may comprise alternative semiconductor materials (e.g., semiconductors comprising group III-V elements and alloys thereof) or conductive materials.

In an embodiment, the source region 121 and the drain region 122 may be spaced apart by an integer multiple of the standard pitch of features on the substrate. The standard pitch may be the distance P. As shown, the distance P begins on the left edge of the source region 121 and extends to the left edge of a voided region 118. The voided region 118 is referred to as being voided because the voided region 118 occupies the area that would otherwise be occupied by a source/drain region in a standard nanoribbon device. As such, the voided region 118 may have the same dimensions as the source region 121 and the drain region 122. In an embodiment, the voided region 118 may be filled by an insulating layer 140, such as an oxide. For example, the second regions $110_B$ of the nanoribbons 110 may pass through the voided region 118 and be surrounded by the insulating layer 140. That is, the insulating layer 140 may directly contact the nanoribbons 110 without there being an intervening gate dielectric layer.

In the illustrated embodiment, the source region 121 is spaced apart from the drain region 122 by a distance equal to twice the pitch 2P. In a standard nanowire transistor, the drain region 122 would be immediately adjacent to the gate structure $130_A$ (i.e., at a spacing of P). However, in embodiments disclosed herein, the drain region 122 is spaced further away from the source region 121. For example, the voided region 118 and a dummy gate structure $130_B$ are between the gate structure $130_A$ and the drain region 122. Particularly, the gate structure $130_A$ is closer to the source region 121 than the drain region 122. The additional distance between the drain region 122 and the gate structure $130_A$ provides a distance over which the voltage can be dropped, as described above.

In an embodiment, a portion of the second regions $110_B$ of the nanoribbons 110 may be covered by a dummy gate structure $130_B$. The dummy gate structure $130_B$ may be substantially similar to the gate structure $130_A$, with the exception that the dummy gate structure $130_B$ is not electrically connected to the circuit. That is, the dummy electrode 135 may be referred to as floating. The dummy gate structure $130_B$ may be present as a manufacturing artifact in order to accommodate the extended spacing between the drain region 122 and the gate structure $130_A$. For example, the dummy gate structure $130_B$ may be formed substantially in parallel with the gate structure $130_A$.

In an embodiment, the gate structure $130_A$ and the dummy gate structure $130_B$ may comprise features typical of nanoribbon transistors. For example, the gate structure $130_A$ and the dummy gate structure $130_B$ may each comprise a pair of spacers 132, a gate dielectric 131, and a gate electrode 135.

In an embodiment, the materials chosen for the gate dielectric 131 may be any suitable high dielectric constant materials. For example, the gate dielectric 131 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, the gate dielectric 131 may be annealed to improve performance.

In an embodiment, the materials chosen for the gate electrodes 135 may be any suitable work function metal in order to provide the desired threshold voltage for operation as a P-type transistor or an N-type transistor. For example, when the metal gate electrode 135 will serve as an N-type workfunction metal, the gate electrode 135 preferably has a workfunction that is between about 3.9 eV and about 4.2 eV. N-type materials that may be used to form the metal gate electrode 135 include, but are not limited to, hafnium, zirconium, titanium, tantalum, aluminum, and metal carbides that include these elements, e.g., titanium carbide, zirconium carbide, tantalum carbide, hafnium carbide and aluminum carbide. Alternatively, when the metal gate electrode 135 will serve as a P-type workfunction metal, the gate electrode 135 preferably has a workfunction that is between about 4.9 eV and about 5.2 eV. P-type materials that may be used to form the metal gate electrode 135 include, but are not limited to, ruthenium, palladium, platinum, cobalt, nickel, and conductive metal oxides, e.g., ruthenium oxide. The gate electrode 135 may also comprise a workfunction metal and a fill metal (e.g., tungsten) over the workfunction metal.

In an embodiment, the gate dielectric 131 and the gate electrode 135 wrap entirely around a perimeter of each nanoribbon 110 within the gate structure $130_A$ and the dummy gate structure $130_B$. As such, gate all around (GAA) control of the nanoribbon transistor 100 is provided. Particularly, the gate dielectric 131 may have a thickness that allows for the gate electrode 135 to fill a spacing between nanoribbons. For example, a thickness of the gate dielectric 131 may be approximately 3 nm or less.

In an embodiment, the gate structure $130_A$ defines a channel region of the nanowire transistor 100. The channel region may include the first regions $110_A$ of the nanoribbons 110. In some embodiments, a portion of the second regions $110_B$ may also extend into the channel region within the gate structure $130_A$.

Figure 1B:
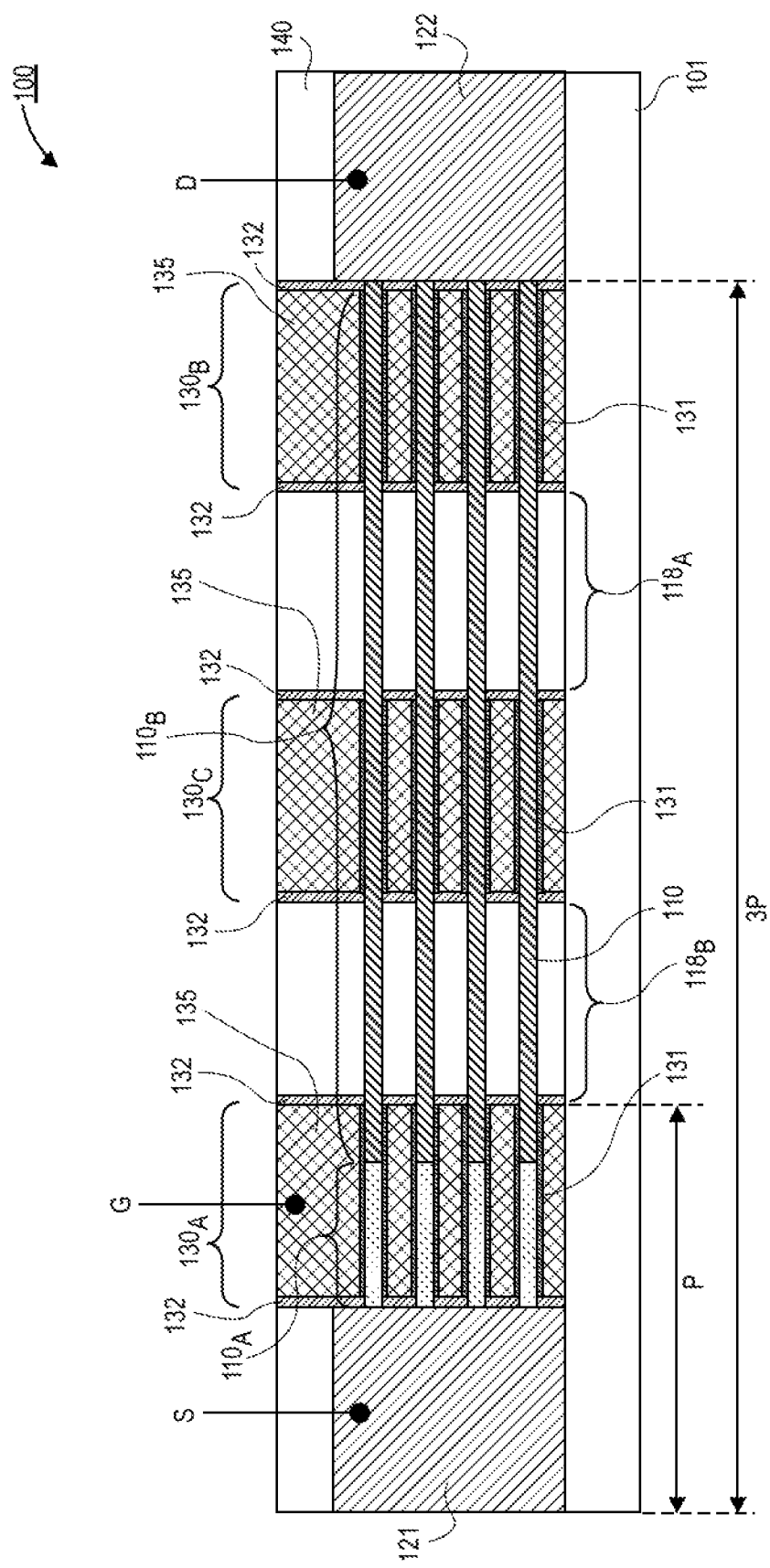
FIG. 1B is a cross-sectional illustration of a nanoribbon transistor that comprises an extended drain region with a pair of dummy electrodes, in accordance with an embodiment.

Referring now to FIG. 1B, a cross-sectional illustration of a nanowire transistor 100 is shown, in accordance with an additional embodiment. The nanowire transistor 100 in FIG. 1B may be substantially similar to the nanowire transistor 100 in FIG. 1A, with the exception that the second regions $110_B$ are longer. Particularly, the second regions $110_B$ are extended so that the drain region 122 is spaced away from the source region 121 by three times the pitch 3P.

Increasing the length of the second regions $110_B$ across a second pitch may result in the formation of an additional dummy gate structure $130_C$ and an additional voided region $118_B$. That is, the nanowire transistor 100 may include a first voided region $118_A$ between the two dummy gate structures $130_B$ and $130_C$ and a second voided region $118_B$ between the gate structure $130_A$ and the second dummy gate structure $130_C$.

Increasing the length of the second regions $110_B$ of the nanoribbons 110 allows for even more voltage to be dropped. As such, even higher voltages are able to be accommodated. While a transistor with a three pitch 3P spacing is shown, it is to be appreciated that the length of the second regions $110_B$ of the nanoribbons 110 may be increased by any integer multiple of the pitch by adding additional voided regions 118 and dummy gate structures 130.

Figure 1C:
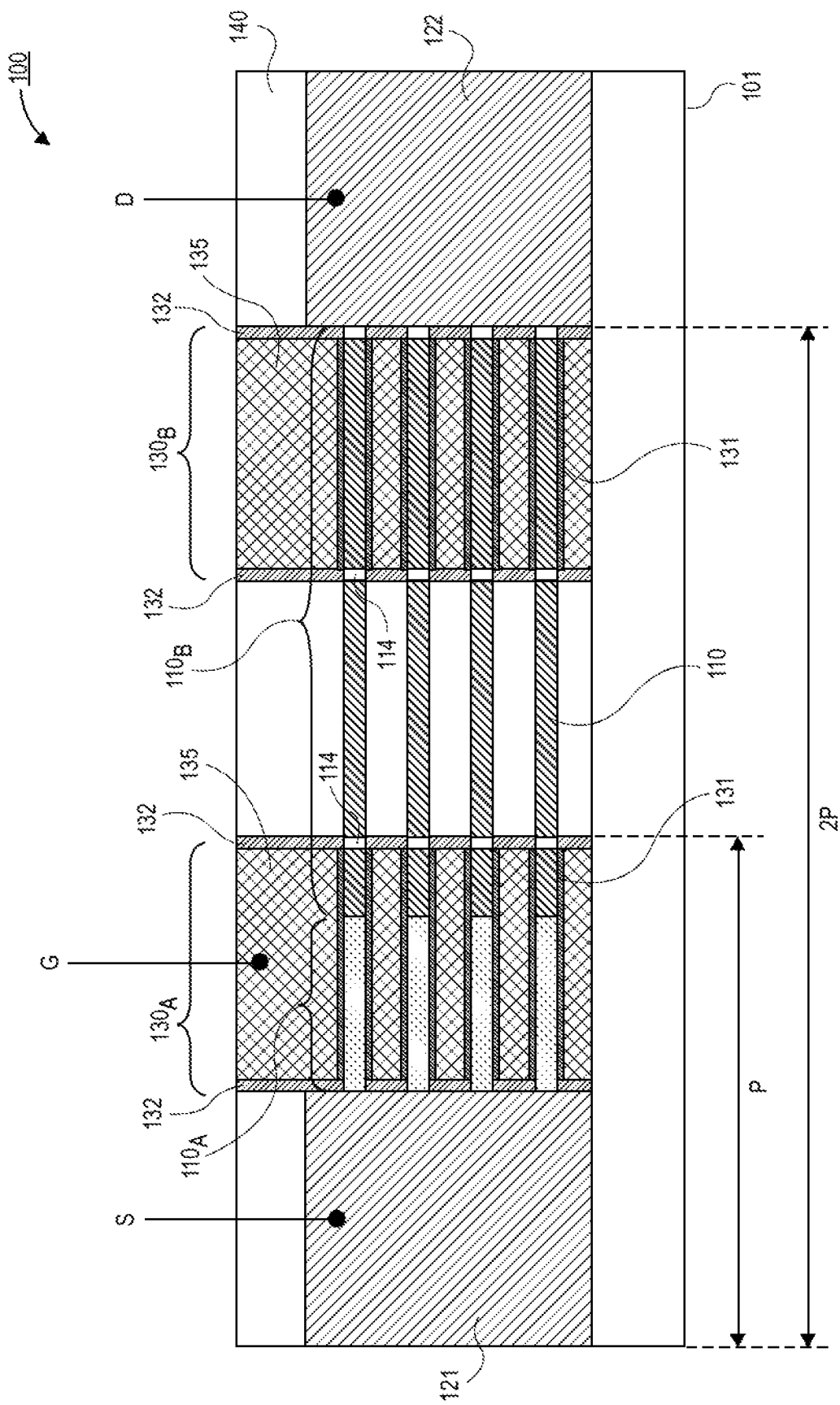
FIG. 1C is a cross-sectional illustration of a nanoribbon transistor that comprises an extended drain region with a non-uniform dopant concentration across a length of the extended drain region, in accordance with an embodiment.

Referring now to FIG. 1C, a cross-sectional illustration of a nanoribbon transistor 100 is shown, in accordance with an additional embodiment. The nanoribbon transistor 100 in FIG. 1C is substantially similar to the nanoribbon transistor 100 in FIG. 1A, with the exception that the second regions $110_B$ of the nanoribbons 110 have a non-uniform dopant concentration across their lengths. Particularly, the second regions $110_B$ comprise one or more low doped regions 114 across their length.

In an embodiment, the low doped regions 114 may be substantially aligned with the spacers 132. The low doped regions 114 are aligned with the spacers 132 because the spacers 132 serve as a mask layer during the doping used to form the second regions $110_B$. That is, the doping of the second regions $110_B$ is implemented after the formation of the spacers 132. An example of such a processing flow is provided below with respect to FIGS. 4A-4J.

In an embodiment, the low doped regions 114 may be identified using one or more different analytical techniques. For example, atom probe tomography (APT) may be used to measure the change in dopant concentration along the length of the second regions $110_B$ of the nanoribbons 110. Due to diffusion, there may not be a stepwise drop from a first (higher) dopant concentration to a second (lower) dopant concentration. However, along a length of the second regions $110_B$, there may be a discernable decrease from a first (higher) dopant concentration to a second (lower) dopant concentration followed by an increase from the second (lower) dopant concentration back to the first (higher) dopant concentration. In an embodiment, the distance between the start of the decrease to the end of the increase may be approximately equal to the width of the spacer 132.

Figure 2:
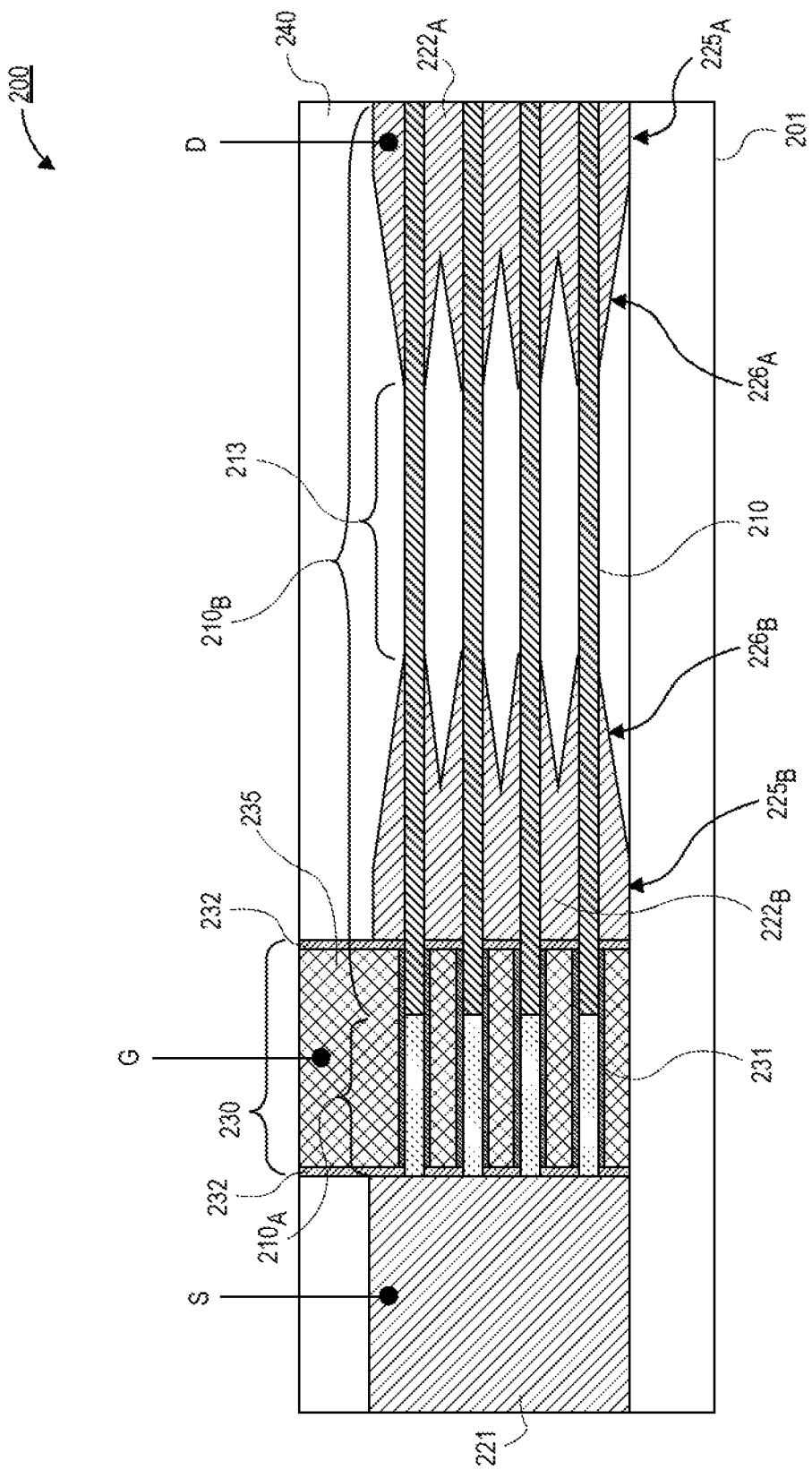
FIG. 2 is a cross-sectional illustration of a nanoribbon transistor that comprises an extended drain region with a dummy drain, in accordance with an embodiment.

Referring now to FIG. 2, a cross-sectional illustration of a nanoribbon transistor 200 is shown, in accordance with an additional embodiment. In an embodiment, the nanoribbon transistor 200 may comprise an extended drain region that is not indexed to the standard pitch of other devices on the substrate 201. That is, the length of the second regions $210_B$ of the nanoribbons 210 is not tied to any pitch requirements. Accordingly, the length of the second regions $210_B$ may be more accurately tailored to provide the desired voltage drop. Additionally, in some embodiments, the transistor 200 may not include a dummy gate structure, such as described above.

In an embodiment, the nanoribbon transistor 200 comprises a source 221, a gate structure 230 and a drain $222_A$. A vertically oriented stack of nanoribbons 210 may extend between the source 221 and the drain $222_A$. The source 221 and the gate structure 230 may be substantially similar to those described above with respect to FIG. 1A. For example, the gate structure 230 may comprise a pair of spacers 232, a gate dielectric 231, and a gate electrode 235. In an embodiment, the nanoribbons 210 may comprise first regions $210_A$ and second regions $210_B$. Aside from the added flexibility in the control of the length of the second regions $210_B$, the nanoribbons 210 may be substantially similar to the nanoribbons 110 described above.

In an embodiment, the drain region $222_A$ may have a different shape than the drain region 122 described above. Particularly, the difference in shape may be attributable to the unconfined epitaxial growth of the drain material. In the illustrated embodiment, the drain region $222_A$ is confined along the right edge (e.g., by a spacer that is not shown) and is unconfined on the left edge. As such, the epitaxial growth at the end of the second regions $210_B$ may merge together to provide a main body $225_A$ of drain material. In an embodiment, protrusions $226_A$ may extend away from the main body towards the gate structure 230. In an embodiment, the protrusions $226_A$ may be tapered towards the surfaces of the second regions $210_B$ of the nanoribbons 210. That is, the number of protrusions $226_A$ may equal the number of nanoribbons 210, with each protrusion $226_A$ wrapping around one of the nanoribbons 210.

In an embodiment, the entire length of the second regions $210_B$ of the nanoribbons 210 outside of the gate structure 230 may be exposed during the epitaxial growth of the drain region $222_A$. As such, epitaxial growth may also occur adjacent to the gate structure 230 to form a dummy drain region $222_B$. The dummy drain region $222_B$ may be a mirror image of the drain region $222_A$. That is, the dummy drain region $222_B$ may comprise a main body $225_B$ and a plurality of protrusions $226_B$ that extend away from the gate structure 230. Whereas the drain region $222_A$ is connected to circuitry outside of the nanoribbon transistor 200, the dummy drain region $222_B$ is not directly connected to external circuitry.

In an embodiment, the protrusions $226_A$ and $226_B$ may be spaced away from each other by a third region 213 of the nanoribbons 210. The third region 213 is a portion of the second regions that is outside of the gate structure 230 and is not covered by drain or dummy drain material. The third region 213 may be directly contacted by an insulating layer 240 that wraps around the nanoribbons 210 in the third region 213. In an embodiment, the length of the third region 213 may provide substantially all of the voltage drop across the length of the nanoribbons 210.

Referring now to FIGS. 3A-3J, a series of illustrations depicting a process for forming a transistor device with an extended drain region is shown, in accordance with an embodiment. In an embodiment, the process flow described may result in the formation of a nanoribbon transistor 300 substantially similar to the nanoribbon transistor 100 described with respect to FIG. 1A. However, similar processing operations may be used to form a nanoribbon transistor similar to the nanoribbon transistor 100 described with respect to FIG. 1B by including an additional voided region and an additional dummy gate structure.

Figure 3A:
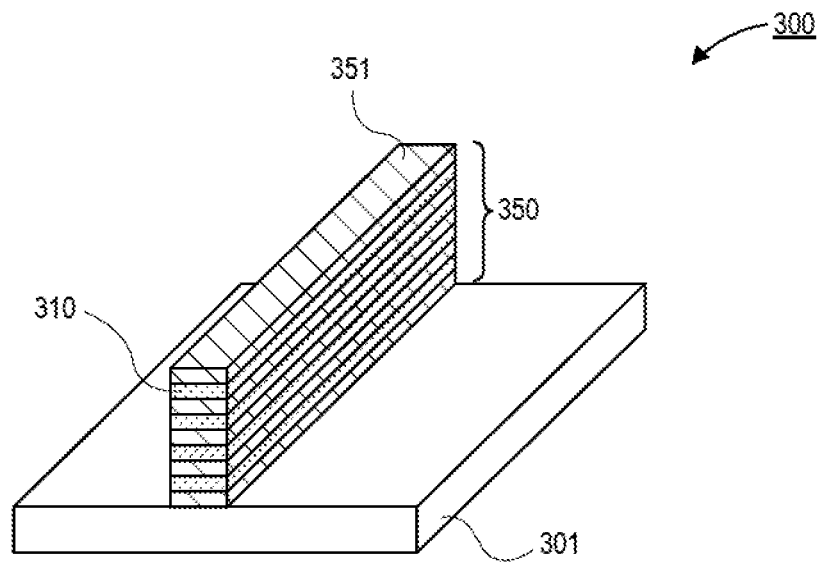
FIGS. 3A-3J are illustrations depicting a process for forming a nanoribbon transistor that comprises an extended drain region with a dummy electrode, in accordance with an embodiment.

Referring now to FIG. 3A, a perspective view illustration of a semiconductor device 300 with a fin stack 350 disposed over a substrate 301 is shown, in accordance with an embodiment. In an embodiment, the fin stack 350 may comprise alternating semiconductor body layers 310 and sacrificial layers 351. The semiconductor body layers 310 may be nanoribbons or nanowires. For simplicity, the semiconductor body layers 310 will be referred to herein as nanoribbons 310.

In an embodiment, the nanoribbons 310 and sacrificial layers 351 may each be a material such as, but not limited to, silicon, germanium, SiGe, GaAs, InSb, GaP, GaSb, InAlAs, InGaAs, GaSbP, GaAsSb, and InP. In a specific embodiment, the nanoribbons 310 are silicon and the sacrificial layers 351 are SiGe. In another specific embodiment, the nanoribbons 310 are germanium, and the sacrificial layers 351 are SiGe. The nanoribbons 310 and the sacrificial layers 351 may be grown with an epitaxial growth processes and patterned into a fin shape, as shown.

In the illustrated embodiment there are four nanoribbons 310. However, it is to be appreciated that there may be any number of nanoribbons 310 in the stack 350. In an embodiment, the topmost layer of the stack 350 is a sacrificial layer 351. In other embodiments, the topmost layer of the stack 350 may be a nanoribbon 310.

Figure 3B:
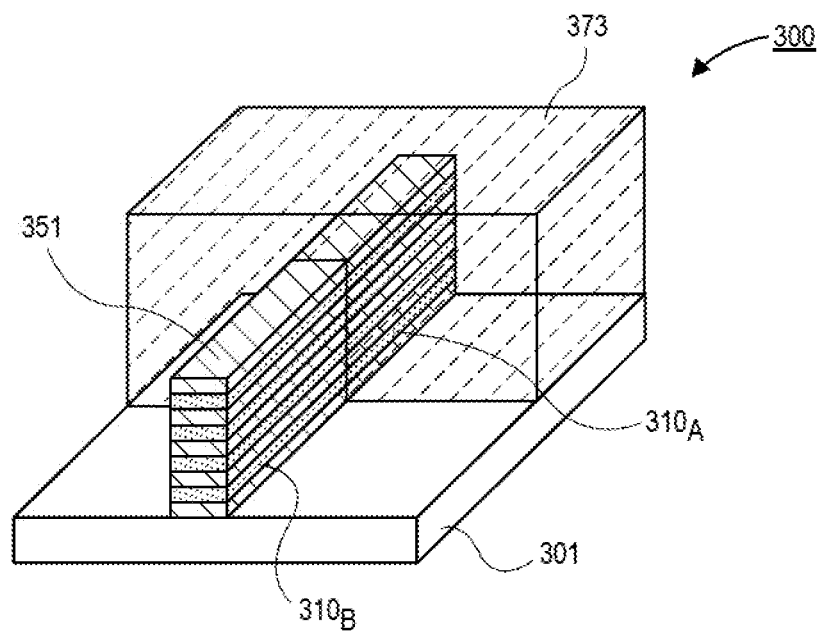

Referring now to FIG. 3B, a perspective view illustration after a dopant implantation has been implemented on the stack 350 is shown, in accordance with an embodiment. As shown, first regions $310_A$ of the nanoribbons 310 may be masked with a mask layer 373, and second regions $310_B$ of the nanoribbons 310 may be exposed. The second regions $310_B$ may be doped with suitable dopants to change the conductivity type of the second regions $310_B$. For example, the first regions $310_A$ may be P-type and the second regions $310_B$ may be N-type. In an embodiment, the dopant concentration of the second regions $310_B$ may be approximately $10^{19}$ cm$^{-3}$ or lower. In a particular embodiment, the dopant concentration of the second regions $310_B$ may be between approximately $10^{17}$ cm$^{-3}$ and approximately $10^{18}$ cm$^{-3}$.

Figure 3C:
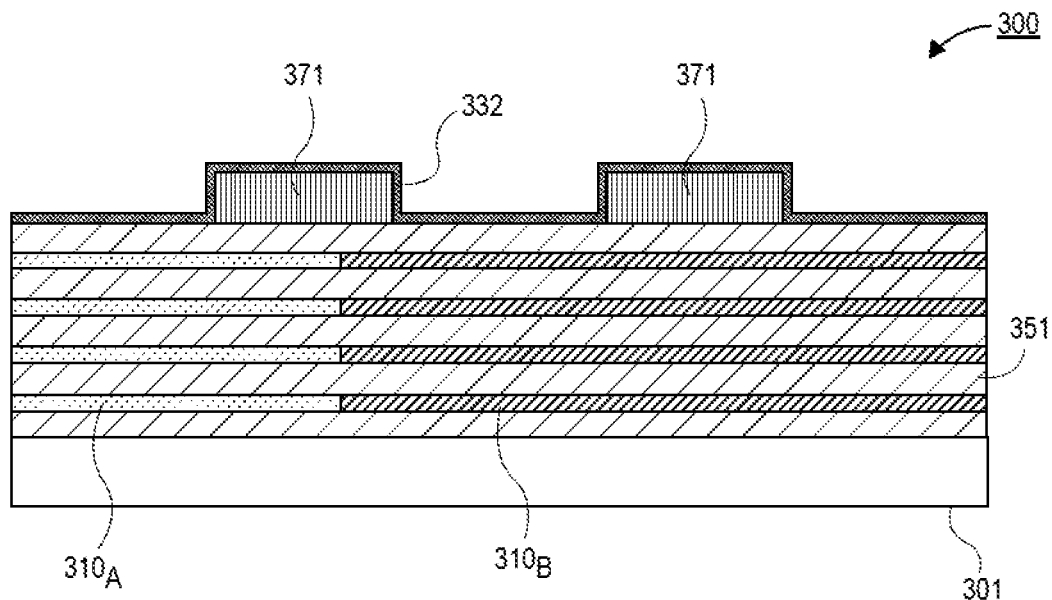

Referring now to FIG. 3C, a cross-sectional illustration along the length of the nanoribbons 310 after sacrificial gates 371 and spacers 332 are disposed over the stack 350 is shown, in accordance with an embodiment. In an embodiment, a pair of sacrificial gates 371 are shown. A first of the sacrificial gates 371 may be disposed over the interface between the first regions $310_A$ and the second regions $310_B$, and a second of the sacrificial gates 371 may be disposed over only the second regions $310_B$. In an embodiment, the sacrificial gates 371 are spaced at a standard spacing for gate electrodes on the rest of the substrate. That is, no special patterning is needed to form the transistor 300. In an embodiment, the sacrificial gates 371 may comprise polysilicon or the like.

Figure 3D:
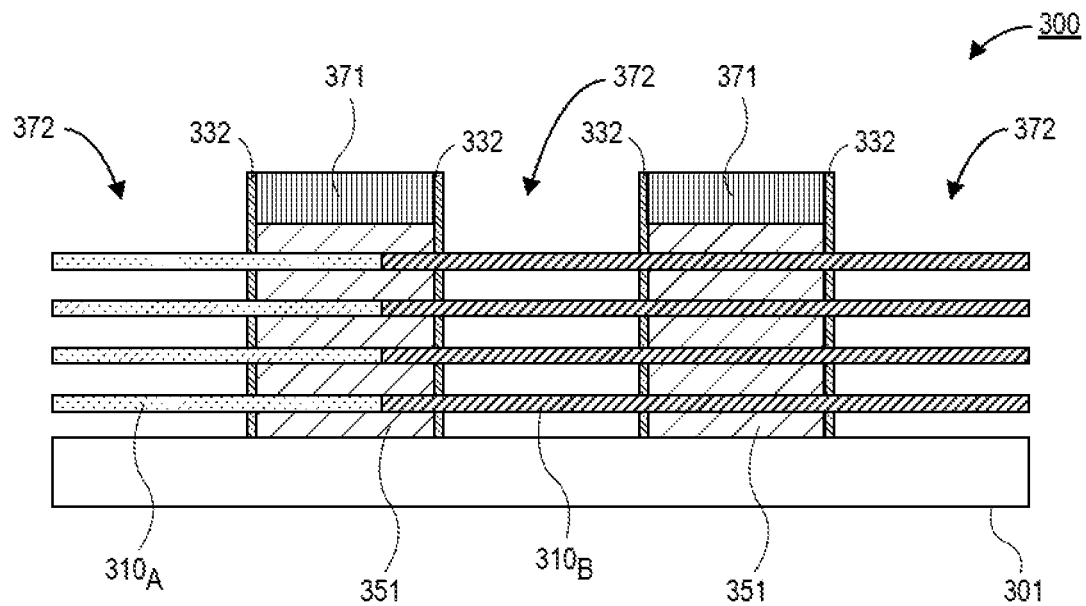

Referring now to FIG. 3D, a cross-sectional illustration of the nanoribbon transistor 300 after source/drain openings 372 are formed is shown, in accordance with an embodiment. In an embodiment, the openings 372 may be located adjacent to ends of the sacrificial gates 371. In an embodiment, forming the openings 372 may comprise removing the exposed portions of the sacrificial layers 351. Sacrificial layers 351 may be removed using any known etchant that is selective to nanoribbons 310. In an embodiment, the selectivity is greater than 100:1. In an embodiment where nanoribbons 310 are silicon and sacrificial layers 351 are silicon germanium, sacrificial layers 351 are selectively removed using a wet etchant such as, but not limited to, aqueous carboxylic acid/nitric acid/HF solution and aqueous citric acid/nitric acid/HF solution. In an embodiment where nanoribbon 310 are germanium and sacrificial layers 351 are silicon germanium, sacrificial layers 351 are selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solution. In another embodiment, sacrificial layers 351 are removed by a combination of wet and dry etch processes.

Figure 3E:
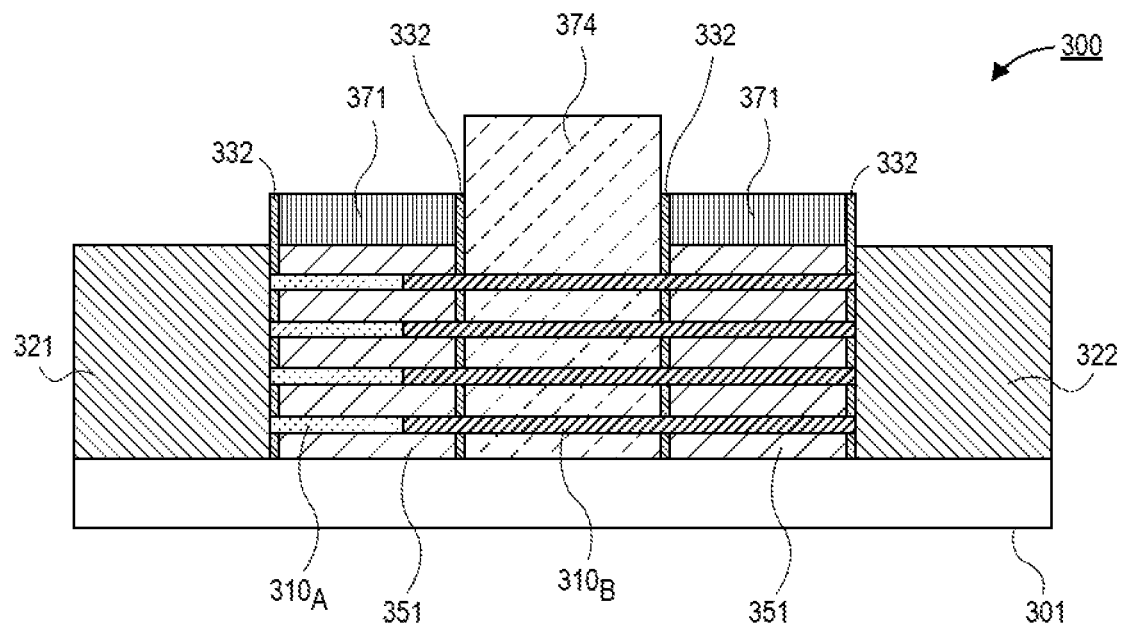

Referring now to FIG. 3E, a cross-sectional illustration of the nanoribbon transistor 300 after the source region 321 and the drain region 322 are formed is shown, in accordance with an embodiment. In an embodiment, the opening 372 between the sacrificial gates 371 may be filled with a mask layer 374. For example, the mask layer 374 may be a carbon hardmask (CHM) or the like. The source region 321 and the drain region 322 may be grown with an epitaxial growth process using materials such as those described above.

Figure 3F:
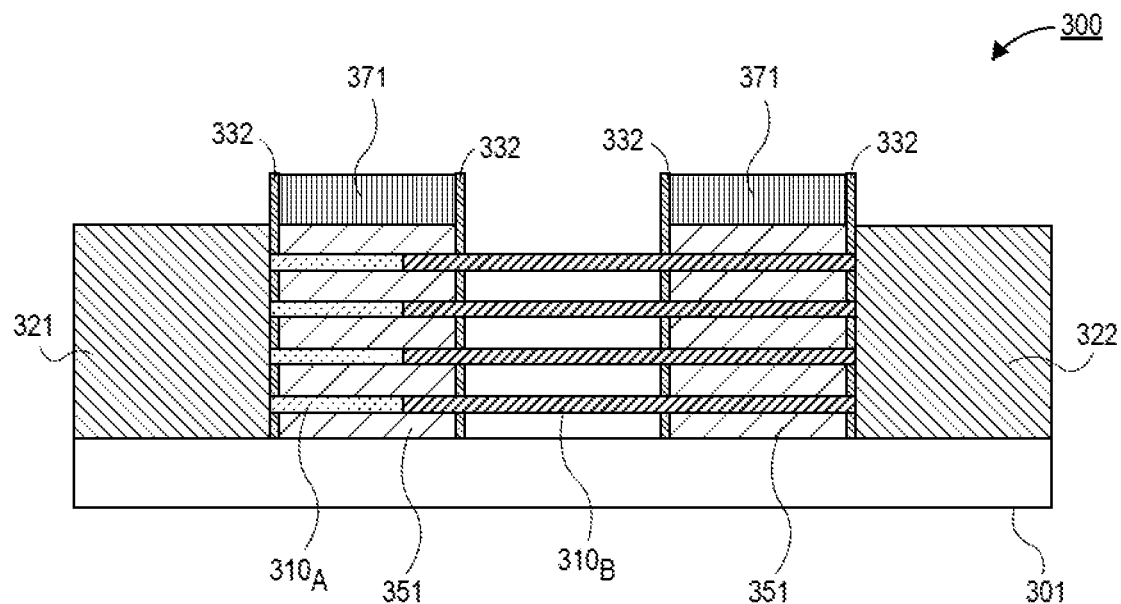

Referring now to FIG. 3F, a cross-sectional illustration of the nanoribbon transistor 300 after the mask layer 374 is removed is shown, in accordance with an embodiment. In an embodiment, the mask layer 374 may be removed with an ashing process or the like.

Figure 3G:
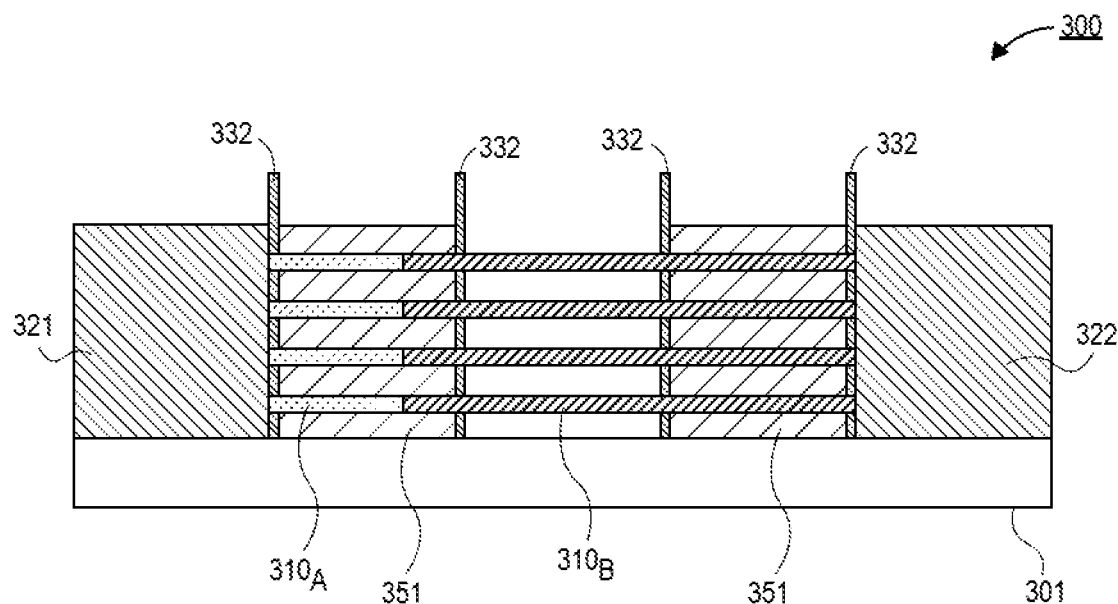

Referring now to FIG. 3G, a cross-sectional illustration of the nanoribbon transistor 300 after the sacrificial gates 371 are removed is shown, in accordance with an embodiment. For example, the sacrificial gates 371 may be removed with an etching process that is selective to the material of the sacrificial gates 371. Removal of the sacrificial gates 371 exposes the remaining portions of the sacrificial layers 351.

Figure 3H:
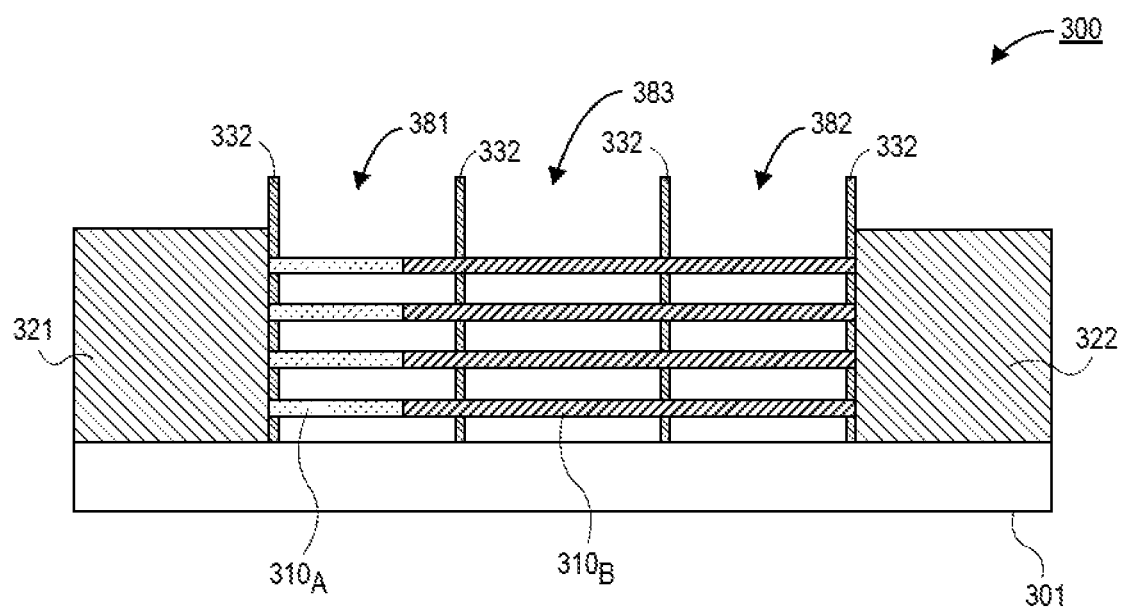

Referring now to FIG. 3H, a cross-sectional illustration of the nanoribbon transistor 300 after the sacrificial layers 351 are removed is shown, in accordance with an embodiment. The sacrificial layers 351 may be removed with an etching process that is selective to the sacrificial layers 351 and leaves the nanoribbons 310 substantially unaltered.

In FIG. 3H, the remaining spacers 332 define three different openings 381, 382, and 383. The opening 381 will be filled by the gate structure. The opening 382 may be the location where a dummy gate structure is formed. The opening 383 may be a voided region.

Figure 3I:
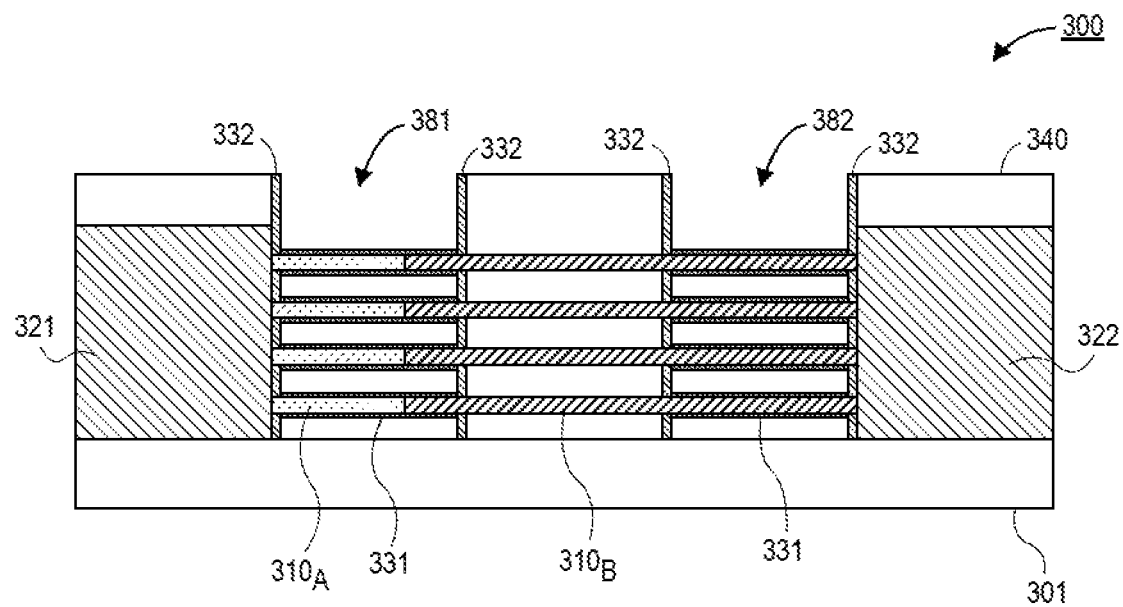

Referring now to FIG. 3I, a cross-sectional illustration of the nanoribbon transistor 300 after gate dielectric 331 is disposed over portions of the nanoribbons 310 is shown, in accordance with an embodiment. In an embodiment, an insulating layer 340 may be disposed prior to forming the gate dielectric 331. The insulating layer 340 may cover the source region 321, the drain region 322, and fill the opening 383. Accordingly, the second regions $310_B$ of the nanoribbons 310 within the third opening 383 are not surrounded by the gate dielectric 331.

In an embodiment, the gate dielectric 331 may cover the portions of the nanoribbons 310 in the opening 381 and the opening 382. Particularly, in opening 381 exposed portions of the first regions $310_A$ and exposed portions of the second regions $310_B$ are covered by the gate dielectric 331. In opening 382 the exposed portions of the second regions $310_B$ are covered by the gate dielectric 331. In the illustrated embodiment, the gate dielectric 331 is shown as only be deposited over the surfaces of the nanoribbons 310. For example, an oxidation process may be used to grow the gate dielectric 331 in such a configuration. In other embodiments, the gate dielectric 331 may be deposited with a deposition process (e.g., atomic layer deposition (ALD)). In such embodiments, the gate dielectric 331 may also cover interior surfaces of the spacers 332 in the openings 381 and 382. The gate dielectric 331 may be any suitable high-k material, such as those described in greater detail above.

Figure 3J:
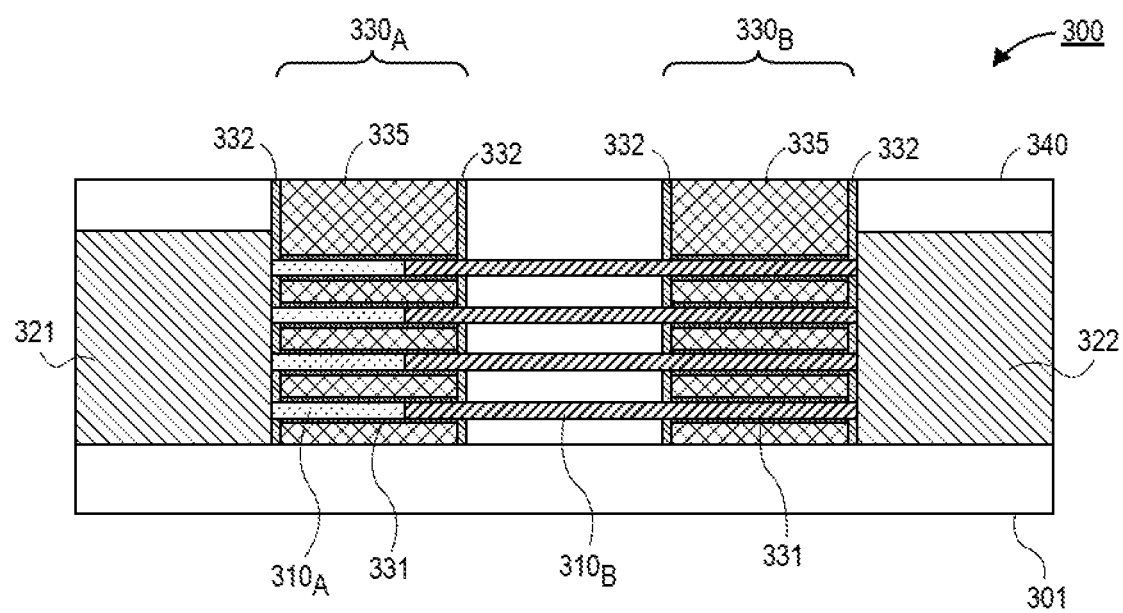

Referring now to FIG. 3J, a cross-sectional illustration of the nanoribbon transistor 300 after gate electrodes 335 are disposed into the openings 381 and 382 is shown, in accordance with an embodiment. In an embodiment, the gate electrodes 335 may be disposed with any suitable deposition process (e.g., chemical vapor deposition (CVD), physical vapor deposition (PVD), ALD, or the like). The gate electrodes 335 may be any suitable material such as the work function metals described above. In an embodiment, the gate electrodes 335 may comprise a workfunction metal and a fill metal (e.g. tungsten).

The deposition of the gate electrodes 335 completes the formation of the gate structure 330A and the dummy gate structure 330B. In an embodiment, the gate electrode 335 of the gate structure 330A will be connected to circuitry outside of the nanoribbon transistor 300, and the dummy gate electrode 335 of the dummy gate structure $330_B$ will be floating. That is, the dummy gate electrode 335 of the dummy gate structure $330_B$ may not be connected to circuitry outside of the nanoribbon transistor 300.

Referring now to FIGS. 4A-4J, a series of cross-sectional illustrations depicting the formation of a nanoribbon transistor 400 is shown, in accordance with an embodiment. The nanoribbon transistor 400 may be similar to the nanoribbon transistor 300, with the exception that the first regions $410_A$ and the second regions $410_B$ are defined at a different point in the process flow. This may result in second regions $410_B$ having a non-uniform dopant concentration across the lengths of the second regions $410_B$.

Figure 4A:
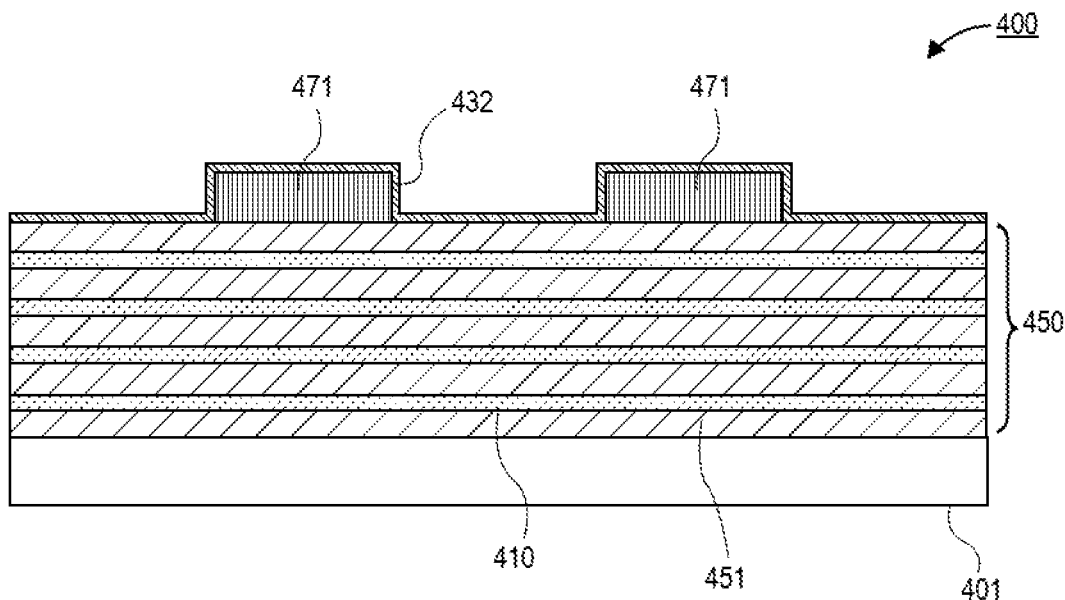
FIGS. 4A-4J are cross-sectional illustrations depicting a process for forming a nanoribbon transistor that comprises an extended drain region with a non-uniform dopant concentration along a length of the extended drain, in accordance with an embodiment.

Referring now to FIG. 4A, a cross-sectional illustration along the length of the nanoribbons 410 after sacrificial gates 471 and spacers 432 are disposed over the stack 450 is shown, in accordance with an embodiment. The stack 450 may be disposed over a substrate 401. In an embodiment, a pair of sacrificial gates 471 are shown. In an embodiment, the sacrificial gates 471 are spaced at a standard spacing for gate electrodes on the rest of the substrate. That is, no special patterning is needed to form the transistor 400. In an embodiment, the sacrificial gates 471 may comprise polysilicon or the like. Spacers 432 may be disposed over the sacrificial gates 471.

Figure 4B:
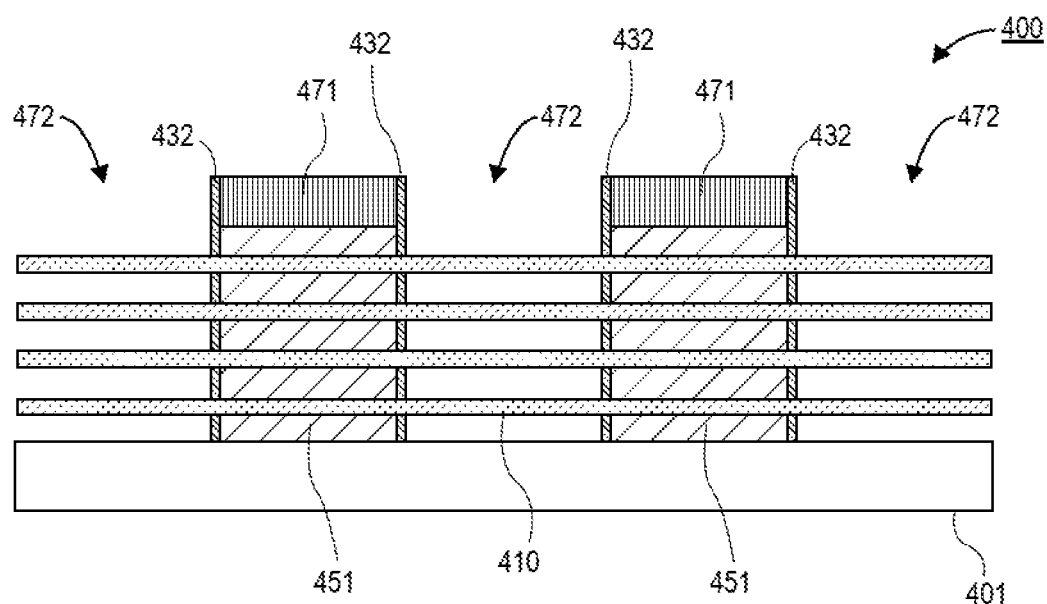

Referring now to FIG. 4B, a cross-sectional illustration of the nanoribbon transistor 400 after source/drain openings 472 are formed is shown, in accordance with an embodiment. In an embodiment, the openings 472 may be located adjacent to ends of the sacrificial gates 471. In an embodiment, forming the openings 472 may comprise removing the exposed portions of the sacrificial layers 451. Sacrificial layers 451 may be removed using any known etchant that is selective to nanoribbons 410. Suitable etching processes are described in greater detail above.

Figure 4C:
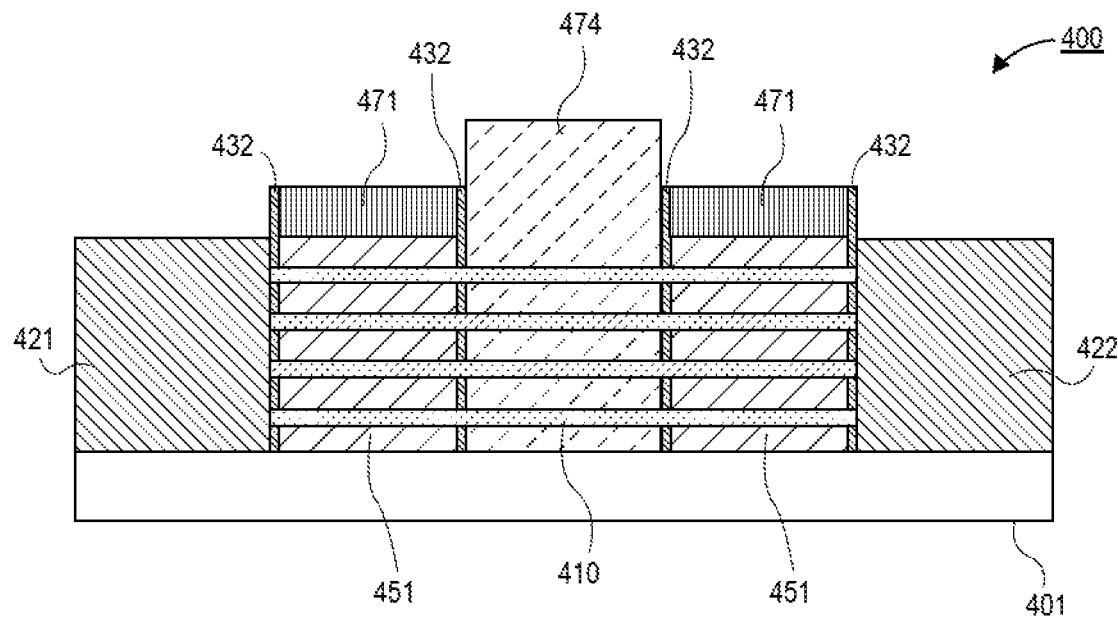

Referring now to FIG. 4C, a cross-sectional illustration of the nanoribbon transistor 400 after the source region 421 and the drain region 422 are formed is shown, in accordance with an embodiment. In an embodiment, the opening 472 between the sacrificial gates 471 may be filled with a mask layer 474. For example, the mask layer 474 may be a CHM or the like. The source region 421 and the drain region 422 may be grown with an epitaxial growth process using materials such as those described above.

Figure 4D:
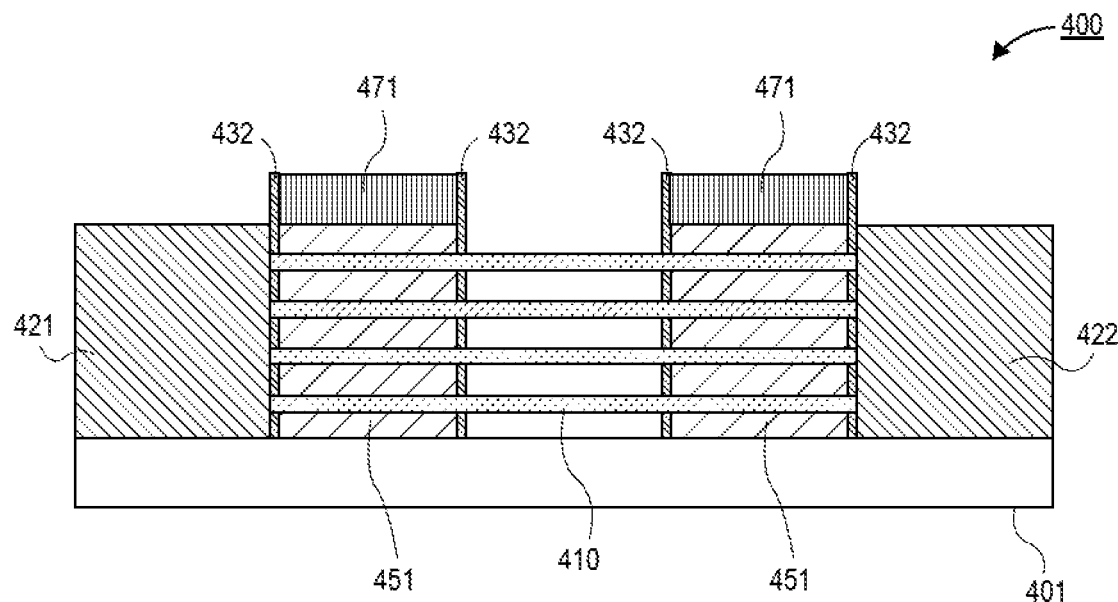

Referring now to FIG. 4D, a cross-sectional illustration of the nanoribbon transistor 400 after the mask layer 474 is removed is shown, in accordance with an embodiment. In an embodiment, the mask layer 474 may be removed with an ashing process or the like.

Figure 4E:
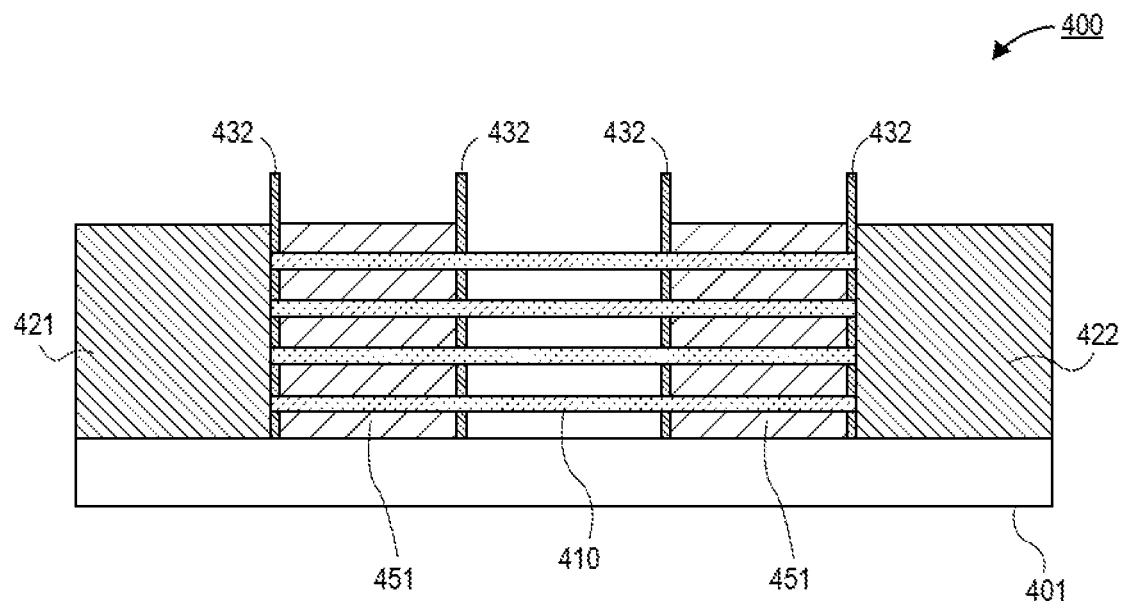

Referring now to FIG. 4E, a cross-sectional illustration of the nanoribbon transistor 400 after the sacrificial gates 471 are removed is shown, in accordance with an embodiment. For example, the sacrificial gates 471 may be removed with an etching process that is selective to the material of the sacrificial gates 471. Removal of the sacrificial gates 471 exposes the remaining portions of the sacrificial layers 451.

Figure 4F:
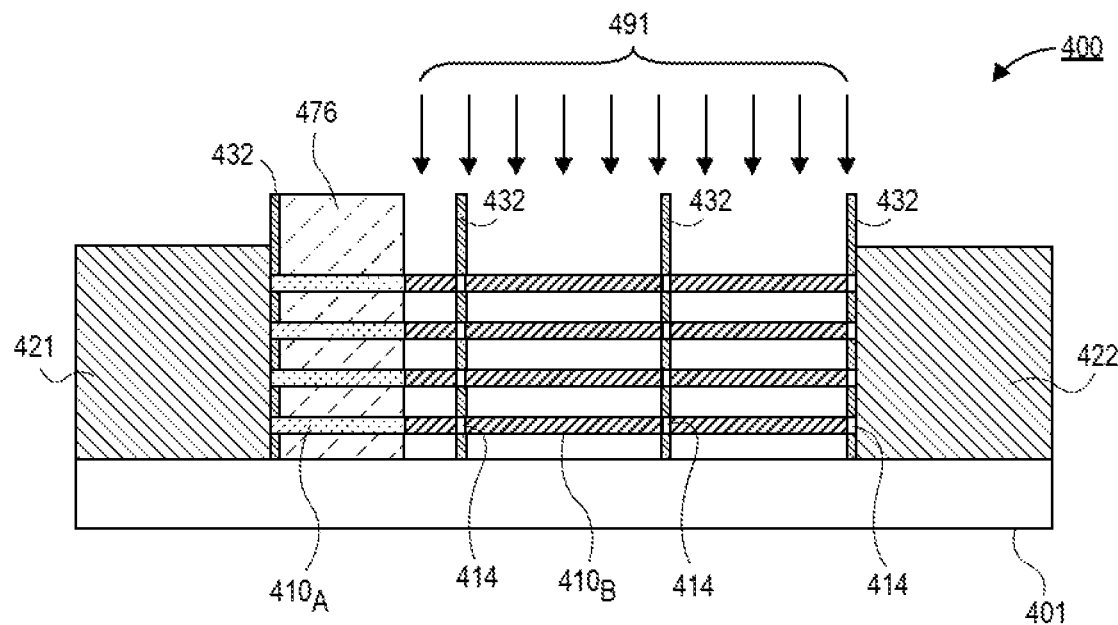

Referring now to FIG. 4F, a cross-sectional illustration of the nanoribbon transistor 400 after sacrificial layers 451 are removed and the nanoribbons 410 are defined into first regions $410_A$ and second regions $410_B$ is shown, in accordance with an embodiment. In an embodiment, the sacrificial layers 451 may be removed with a suitable etching process that is selective to the sacrificial layers 451 over the nanoribbons 410. Suitable etching processes are described above.

After removal of the sacrificial layers 451, a mask layer 476 may be disposed over a portion of the nanoribbons 410 adjacent to the source region 421. A dopant implant 491 may then be executed to dope the second regions $410_B$, while leaving the first regions $410_A$ substantially unaltered. The second regions $410_B$ may be doped with suitable dopants to change the conductivity type of the second regions $410_B$. For example, the first regions $410_A$ may be P-type and the second regions $410_B$ may be N-type. In an embodiment, the dopant concentration of the second regions $410_B$ may be approximately $10^{19}$ cm$^{-3}$ or lower. In a particular embodiment, the dopant concentration of the second regions $410_B$ may be between approximately $10^{17}$ cm$^{-3}$ and approximately $10^{18}$ cm$^{-3}$.

In an embodiment, low doped regions 414 may be present along the length of the second regions $410_B$ of the nanoribbons 410. The low doped regions 414 may be substantially aligned with the spacers 432. That is, the spacers 432 may serve as an additional mask layer that limits the doping in the low doped regions 414. Accordingly, the second regions $410_B$ may have a non-uniform doping concentration along the length of the second regions $410_B$.

In an embodiment, the low doped regions 414 may be identified using one or more different analytical techniques. For example, APT may be used to measure the change in dopant concentration along the length of the second regions $410_B$ of the nanoribbons 410. Due to diffusion, there may not be a stepwise drop from a first (higher) dopant concentration to a second (lower) dopant concentration. However, along a length of the second regions $410_B$, there may be a discernable decrease from a first (higher) dopant concentration to a second (lower) dopant concentration followed by an increase from the second (lower) dopant concentration back to the first (higher) dopant concentration. In an embodiment, the distance between the start of the decrease to the end of the increase may be approximately equal to the width of the spacer 432.

Figure 4G:
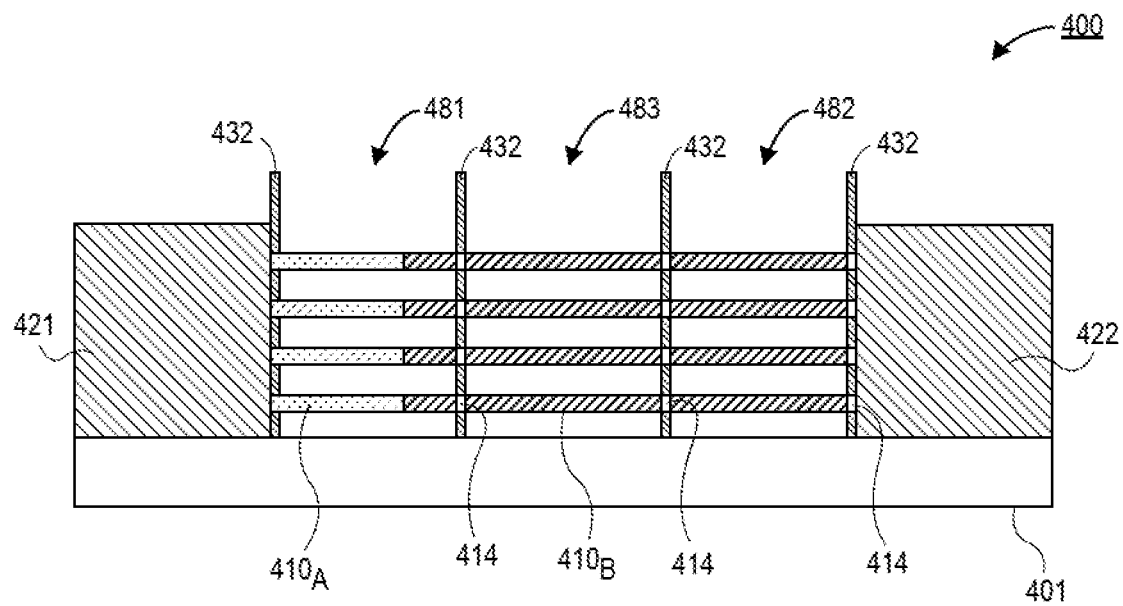

Referring now to FIG. 4G, a cross-sectional illustration of the nanoribbon transistor 400 after the mask layer 476 is removed is shown, in accordance with an embodiment. In an embodiment, the mask layer 476 may be removed with an ashing process, or the like. Removal of the mask layer 476 fully exposes opening 481. Openings 482 and 483 may also be exposed. The opening 481 will be filled by the gate structure. The opening 482 may be the location where a dummy gate structure is formed. The opening 483 may be a voided region.

Figure 4H:
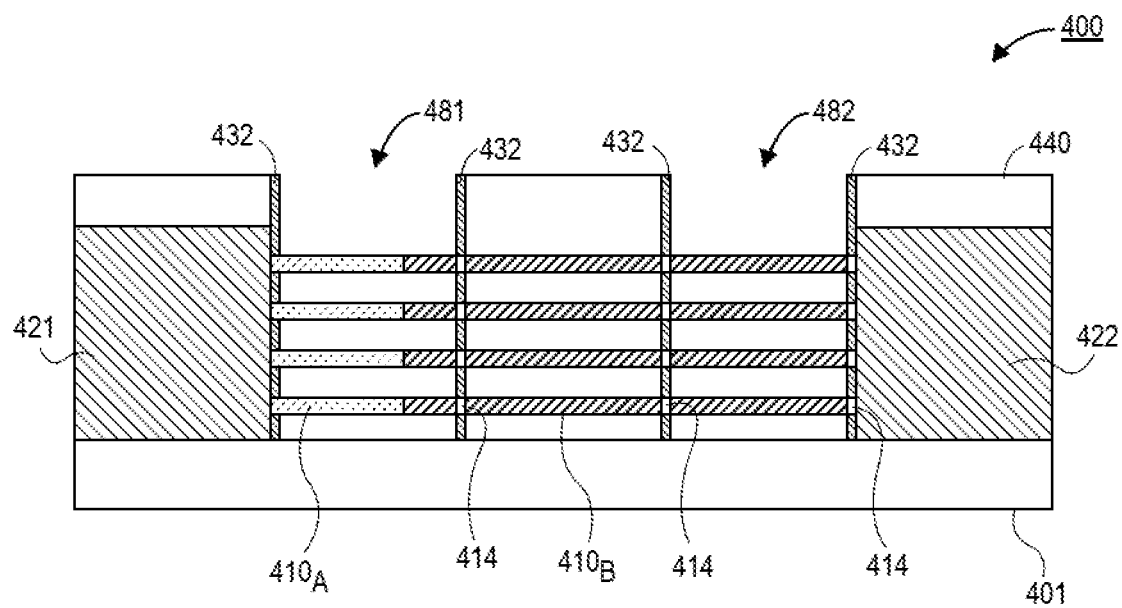

Referring now to FIG. 4H, a cross-sectional illustration of the nanoribbon transistor 400 after an insulating layer 440 is disposed and patterned is shown, in accordance with an embodiment. The insulating layer 440 may cover the source region 421, the drain region 422, and fill the opening 483.

Figure 4I:
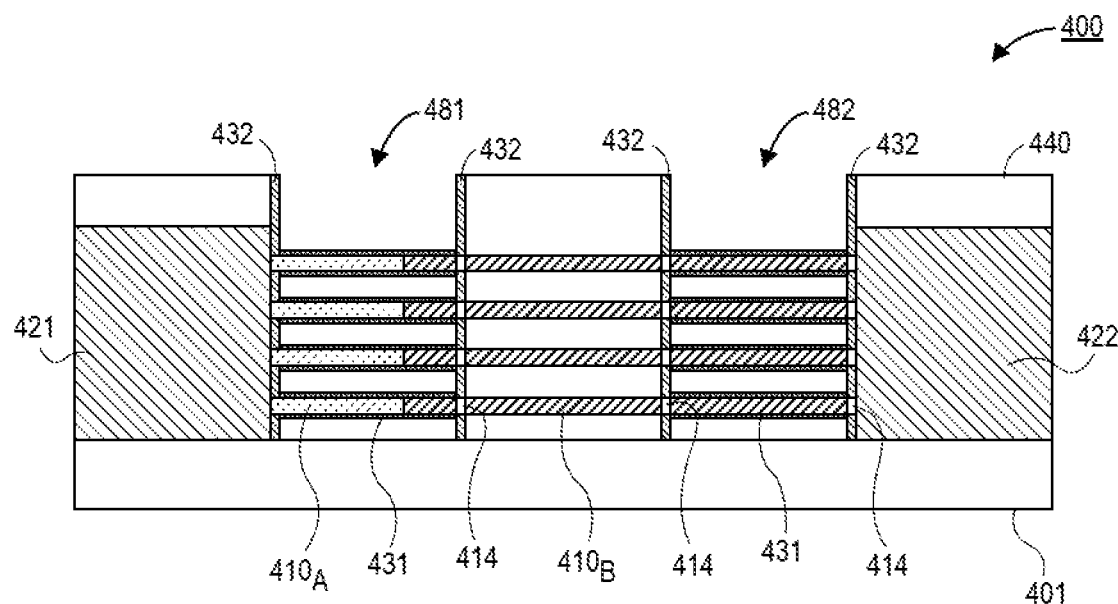

Referring now to FIG. 4I, a cross-sectional illustration of the nanoribbon transistor 400 after the gate dielectric 431 is formed is shown, in accordance with an embodiment. In an embodiment, the gate dielectric 431 may cover the portions of the nanoribbons 410 in the opening 481 and the opening 482. Particularly, in opening 481 exposed portions of the first regions $410_A$ and exposed portions of the second regions $410_B$ are covered by the gate dielectric 431. In opening 482 the exposed portions of the second regions $410_B$ are covered by the gate dielectric 431.

In the illustrated embodiment, the gate dielectric 431 is shown as only deposited over the surfaces of the nanoribbons 410. For example, an oxidation process may be used to grow the gate dielectric 431 in such a configuration. In other embodiments, the gate dielectric 431 may be deposited with a deposition process (e.g., ALD). In such embodiments, the gate dielectric 431 may also cover interior surfaces of the spacers 432 in the openings 481 and 482. The gate dielectric 431 may be any suitable high-k material, such as those described in greater detail above.

Figure 4J:
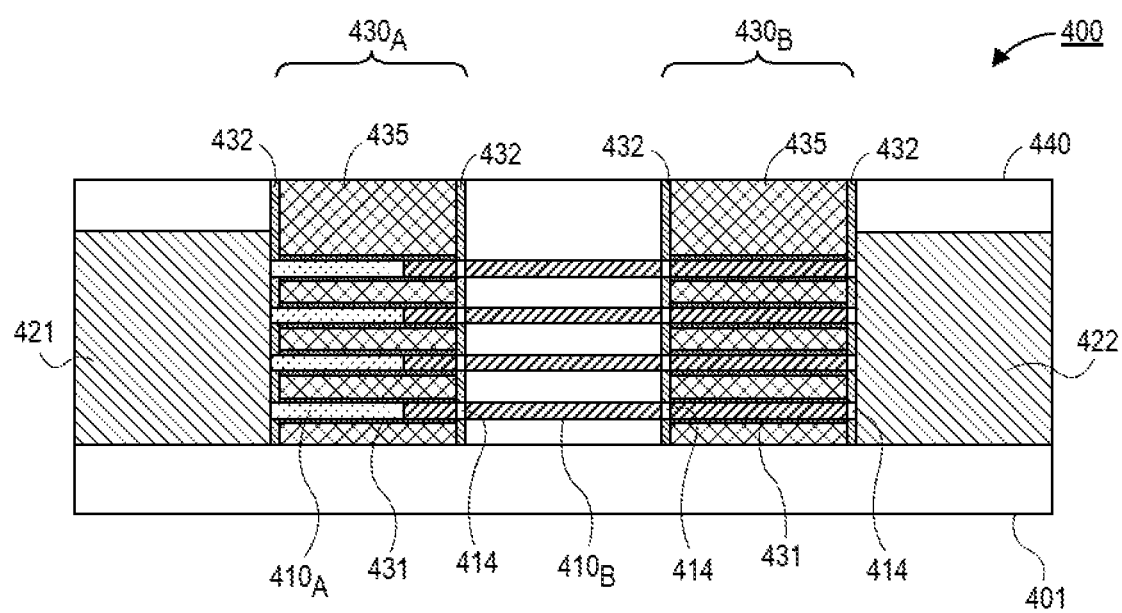

Referring now to FIG. 4J, a cross-sectional illustration of the nanoribbon transistor 400 after gate electrodes 435 are disposed into the openings 481 and 482 is shown, in accordance with an embodiment. In an embodiment, the gate electrodes 435 may be disposed with any suitable deposition process (e.g., CVD, PVD, ALD, or the like). The gate electrodes 435 may be any suitable material such as the work function metals described above. In an embodiment, the gate electrodes 435 may comprise a workfunction metal and a fill metal (e.g. tungsten).

The deposition of the gate electrodes 435 completes the formation of the gate structure $430_A$ and the dummy gate structure $430_B$. In an embodiment, the gate electrode 435 of the gate structure $430_A$ will be connected to circuitry outside of the nanoribbon transistor 400, and the dummy gate electrode 435 of the dummy gate structure $430_B$ will be floating. That is, the dummy gate electrode 435 of the dummy gate structure $430_B$ may not be connected to circuitry outside of the nanoribbon transistor 400.

Referring now to FIGS. 5A-5H, a series of cross-sectional illustrations depicting a process flow for forming a nanoribbon transistor 500 is shown, in accordance with an additional embodiment. The nanoribbon transistor 500 may be substantially similar to the nanoribbon transistor 200 described above. That is, the nanoribbon transistor 500 may have dimensions that are not confined to the standard pitch of other devices on the substrate 501.

Figure 5A:
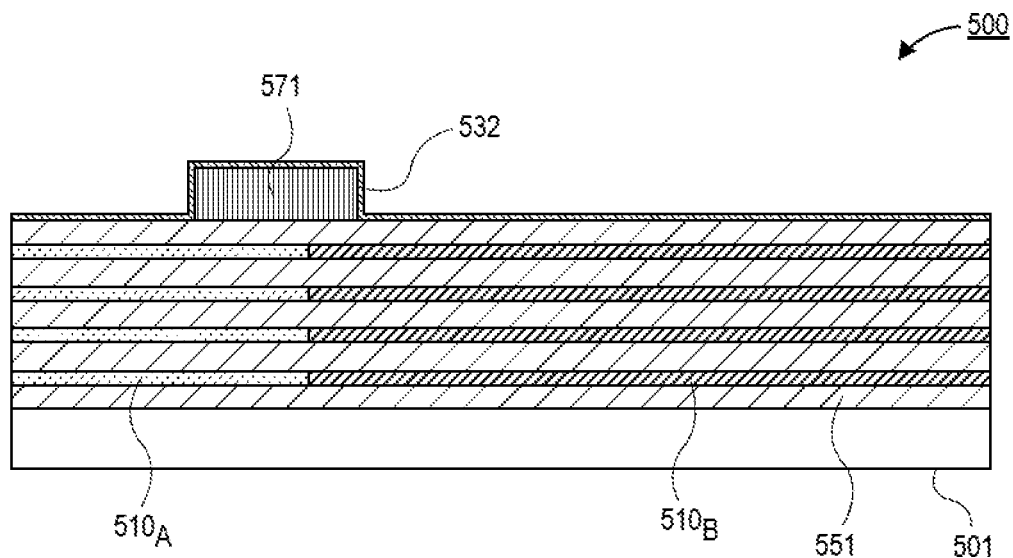
FIGS. 5A-5H are cross-sectional illustrations depicting a process for forming a nanoribbon transistor that comprises an extended drain region with a dummy drain, in accordance with an embodiment.

Referring now to FIG. 5A, a cross-sectional illustration of the nanoribbon transistor 500 after a sacrificial gate 571 and spacer 532 are disposed over a stack of nanoribbons 510 and sacrificial layers 551 is shown, in accordance with an embodiment. In an embodiment, the nanoribbons 510 may comprise first regions $510_A$ and second regions $510_B$. The stack may be formed using similar processes to those described above with respect to FIGS. 3A and 3B. In an embodiment, the sacrificial gate 571 may be disposed over a portion of the first regions $510_A$ and the second regions $510_B$ of the nanoribbons 510.

Figure 5B:
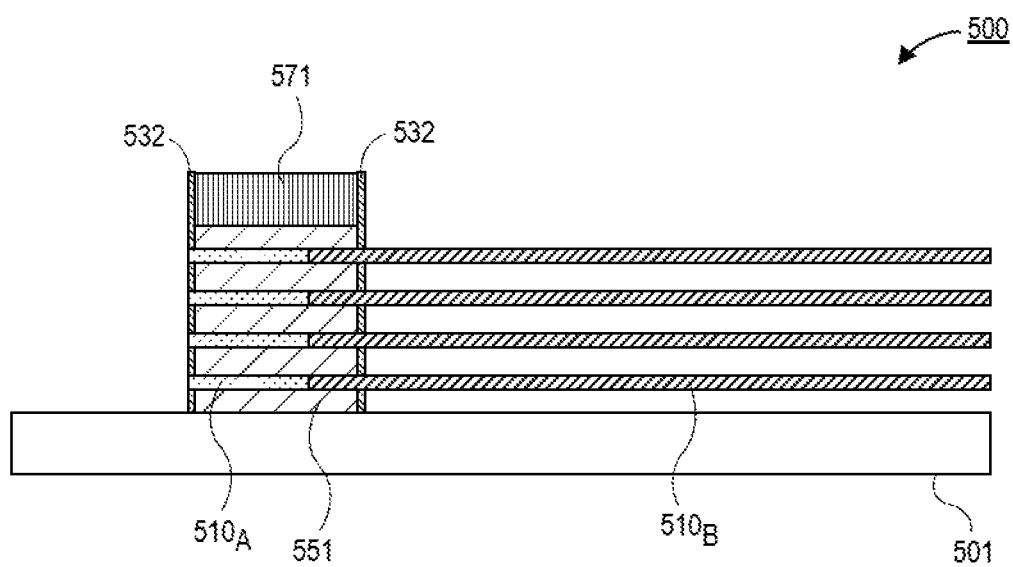

Referring now to FIG. 5B, a cross-sectional illustration of the nanoribbon transistor 500 after portions of the sacrificial layers 551 outside of the spacers 532 are removed is shown, in accordance with an embodiment. The sacrificial layers 551 may be removed with an etching process that is selective to the nanoribbons 510. Suitable etching processes are described above.

Figure 5C:
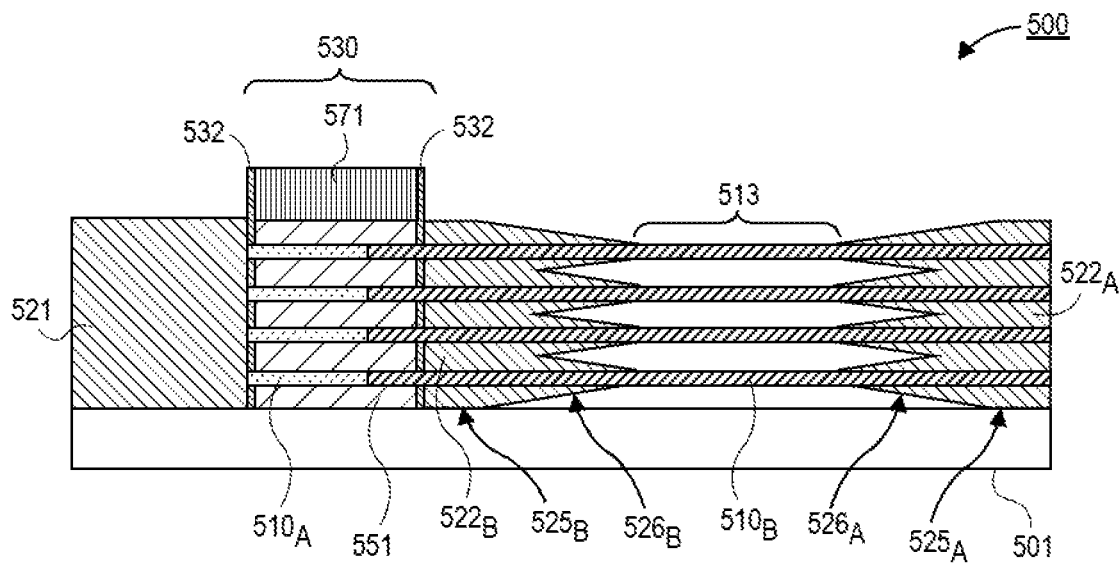

Referring now to FIG. 5C, a cross-sectional illustration of the nanoribbon transistor 500 after a source region 521 and a drain region $522_A$ are formed, is shown in accordance with an embodiment. In an embodiment, the drain region $522_A$ may have a different shape than the source region 521. Particularly, the difference in shape may be attributable to the unconfined epitaxial growth of the drain material. In the illustrated embodiment, the drain region $522_A$ is confined along the right edge (e.g., by a spacer that is not shown) and is unconfined on the left edge. As such, the epitaxial growth at the end of the second regions $510_B$ may merge together to provide a main body $525_A$ of drain material. In an embodiment, protrusions $526_A$ may extend away from the main body towards the source region 521. In an embodiment, the protrusions $526_A$ may be tapered towards the surfaces of the second regions $510_B$ of the nanoribbons 510. That is, the number of protrusions $526_A$ may equal the number of nanoribbons 510, with each protrusion $526_A$ wrapping around one of the nanoribbons 510.

In an embodiment, the entire length of the second regions $510_B$ of the nanoribbons 510 outside of the spacers 532 may be exposed during the epitaxial growth of the drain region $522_A$. As such, epitaxial growth may also occur adjacent to the spacer 532 to form a dummy drain region $522_B$. The dummy drain region $522_B$ may be a mirror image of the drain region $522_A$. That is, the dummy drain region $522_B$ may comprise a main body 525E and a plurality of protrusions $526_B$ that extend away from the gate structure 530.

Whereas the drain region $522_A$ is connected to circuitry outside of the nanoribbon transistor 500, the dummy drain region $522_B$ is not directly connected to external circuitry.

In an embodiment, the protrusions $526_A$ and $526_B$ may be spaced away from each other by a third region 513 of the nanoribbons 510. The third region 513 is a portion of the second regions that is outside of the spacers 532 and is not covered by drain or dummy drain material. In an embodiment, the length of the third region 513 may provide substantially all of the voltage drop across the length of the nanoribbons 510.

Figure 5D:
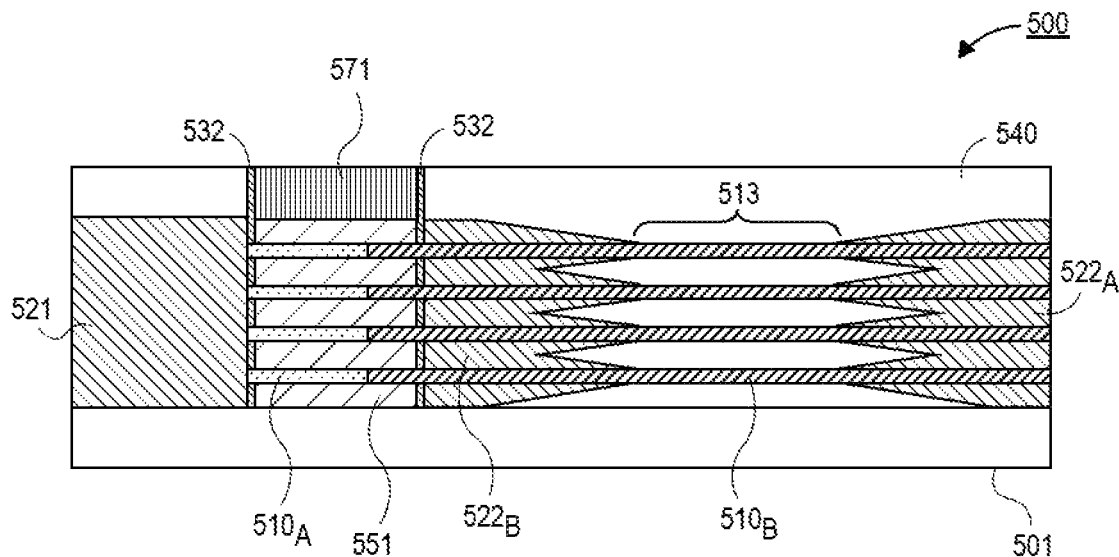

Referring now to FIG. 5D, a cross-sectional illustration of the nanoribbon transistor 500 after an insulating layer 540 is disposed over the device is shown, in accordance with an embodiment. In an embodiment, the insulating layer 540 may directly contact portions of the third region 513 of the nanoribbons 510.

Figure 5E:
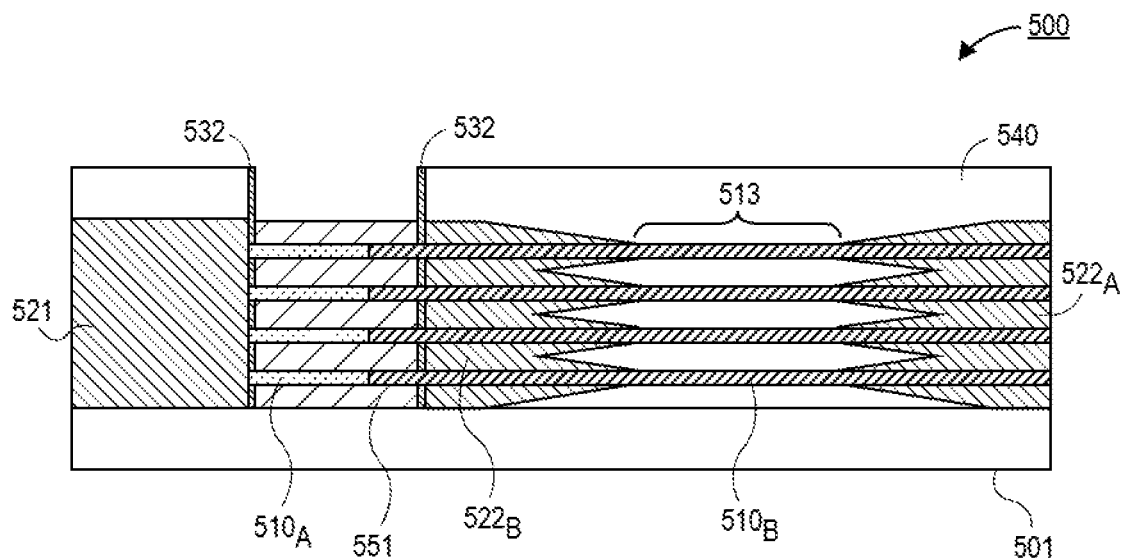

Referring now to FIG. 5E, a cross-sectional illustration of the nanoribbon transistor 500 after the sacrificial gate 571 is removed is shown, in accordance with an embodiment. In an embodiment, the sacrificial gate 571 is removed with any suitable etching process. Removal of the sacrificial gate 571 exposes the sacrificial layers 551.

Figure 5F:
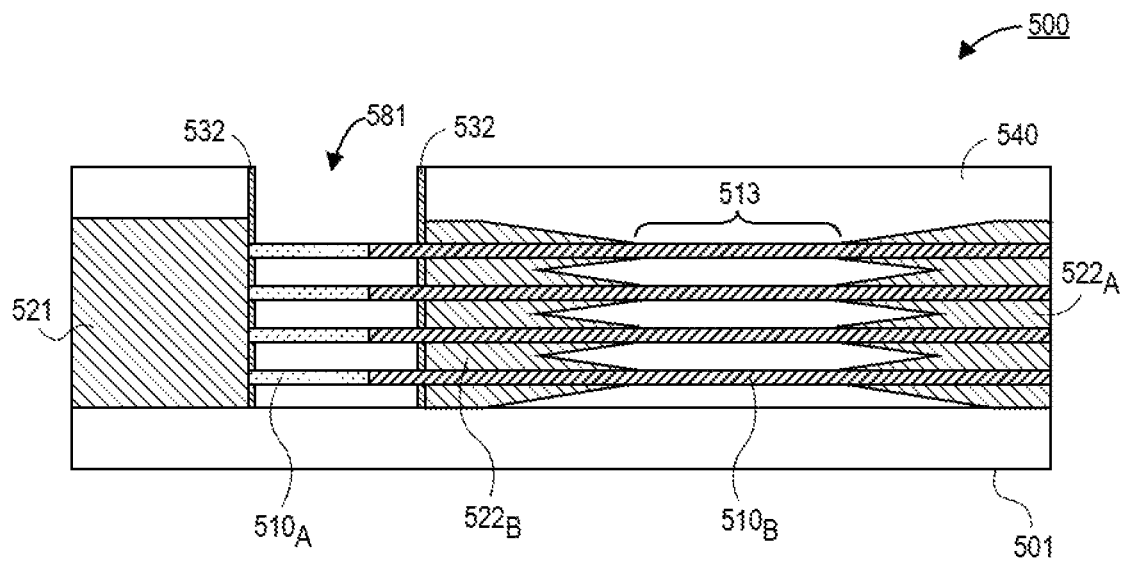

Referring now to FIG. 5F, a cross-sectional illustration of the nanoribbon transistor 500 after the sacrificial layers 551 are removed is shown, in accordance with an embodiment. In an embodiment, the sacrificial layers 551 may be removed with an etching process that is selective to the nanoribbons 510. Suitable etching processes are described above. Removal of the sacrificial layers 551 provides an opening 581 between the spacers 532 where the first regions $510_A$ and the second regions $510_B$ of the nanoribbons 510 are exposed.

Figure 5G:
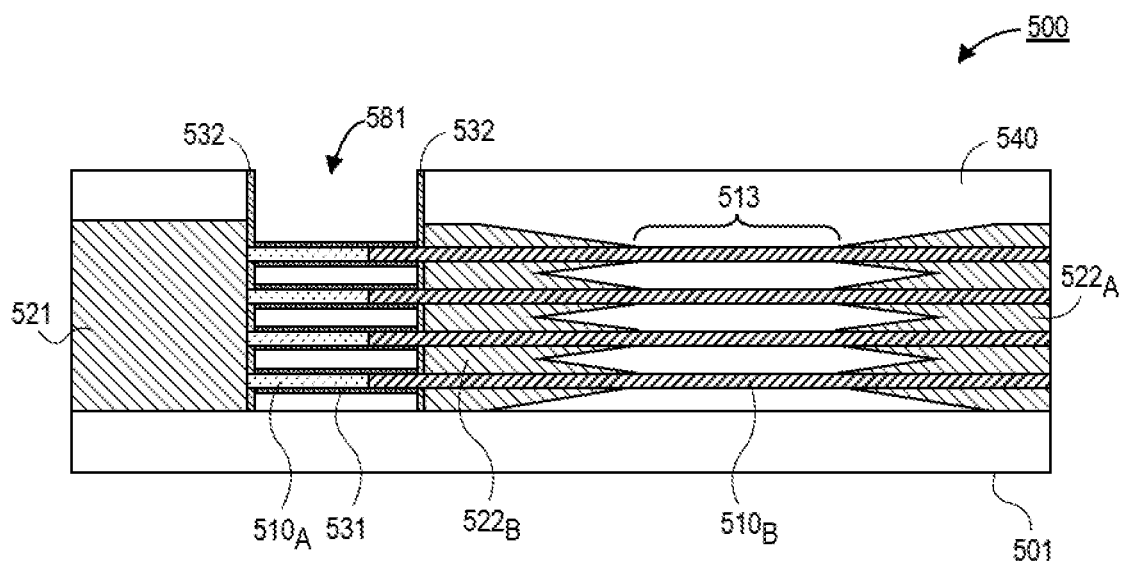

Referring now to FIG. 5G, a cross-sectional illustration of the nanoribbon transistor 500 after a gate dielectric 531 is disposed is shown, in accordance with an embodiment. In an embodiment, the gate dielectric 531 may be formed with an oxidation process or an ALD process. While the gate dielectric 531 is only shown on the nanoribbons 510, it is to be appreciated that the gate dielectric 531 may also be deposited over the interior surfaces of the spacers 532 and over the substrate 501 between the spacers 532.

In contrast to other embodiments, the gate dielectric 531 is only deposited within the spacers 532 of opening 581. That is, the remaining portions of the second regions $510_B$ outside of the spacers 532 are not covered by the gate dielectric 531. Instead, the remaining portions of the second regions $510_B$ are contacted by either the drain region $522_A$, the dummy drain region $522_B$, or the insulating layer 540.

Figure 5H:
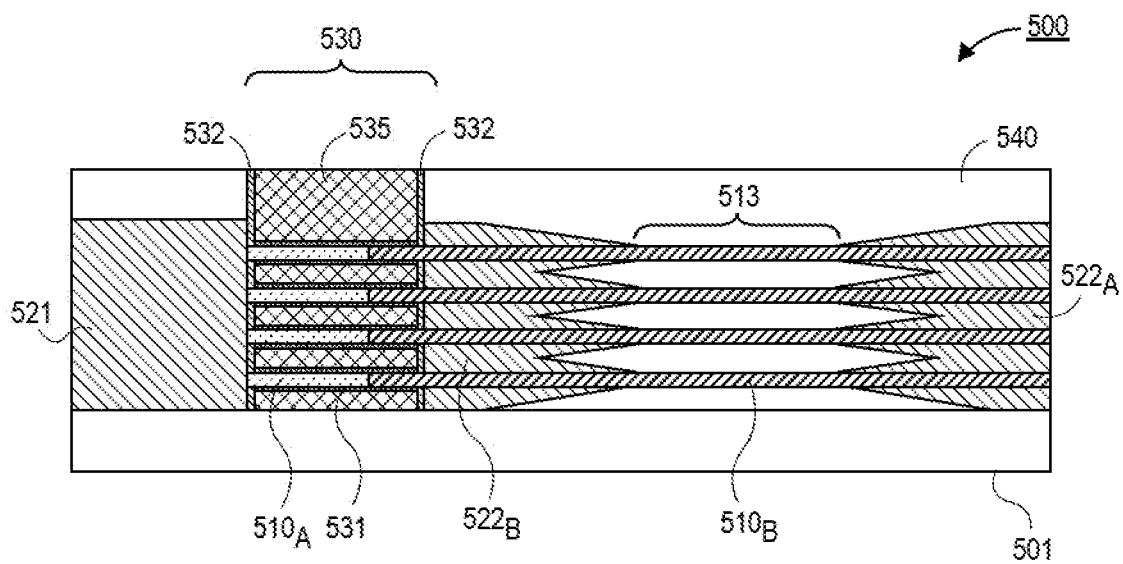

Referring now to FIG. 5H, a cross-sectional illustration of the nanoribbon transistor 500 after a gate electrode 535 is disposed in the opening 581 is shown, in accordance with an embodiment. In an embodiment, the gate electrode 535 may be disposed with any suitable deposition process (e.g., CVD, PVD, ALD, or the like). The gate electrode 535 may be any suitable material such as the work function metals described above. In an embodiment, the gate electrode 535 may comprise a workfunction metal and a fill metal (e.g. tungsten). The deposition of the gate electrode 535 completes the formation of the gate structure 530. In an embodiment, the gate electrode 535 of the gate structure 530 will be connected to circuitry outside of the nanoribbon transistor 500. Furthermore, in some embodiments, there is no dummy gate structure over a portion of the second regions $510_B$ of the nanoribbons 510.

Figure 6:
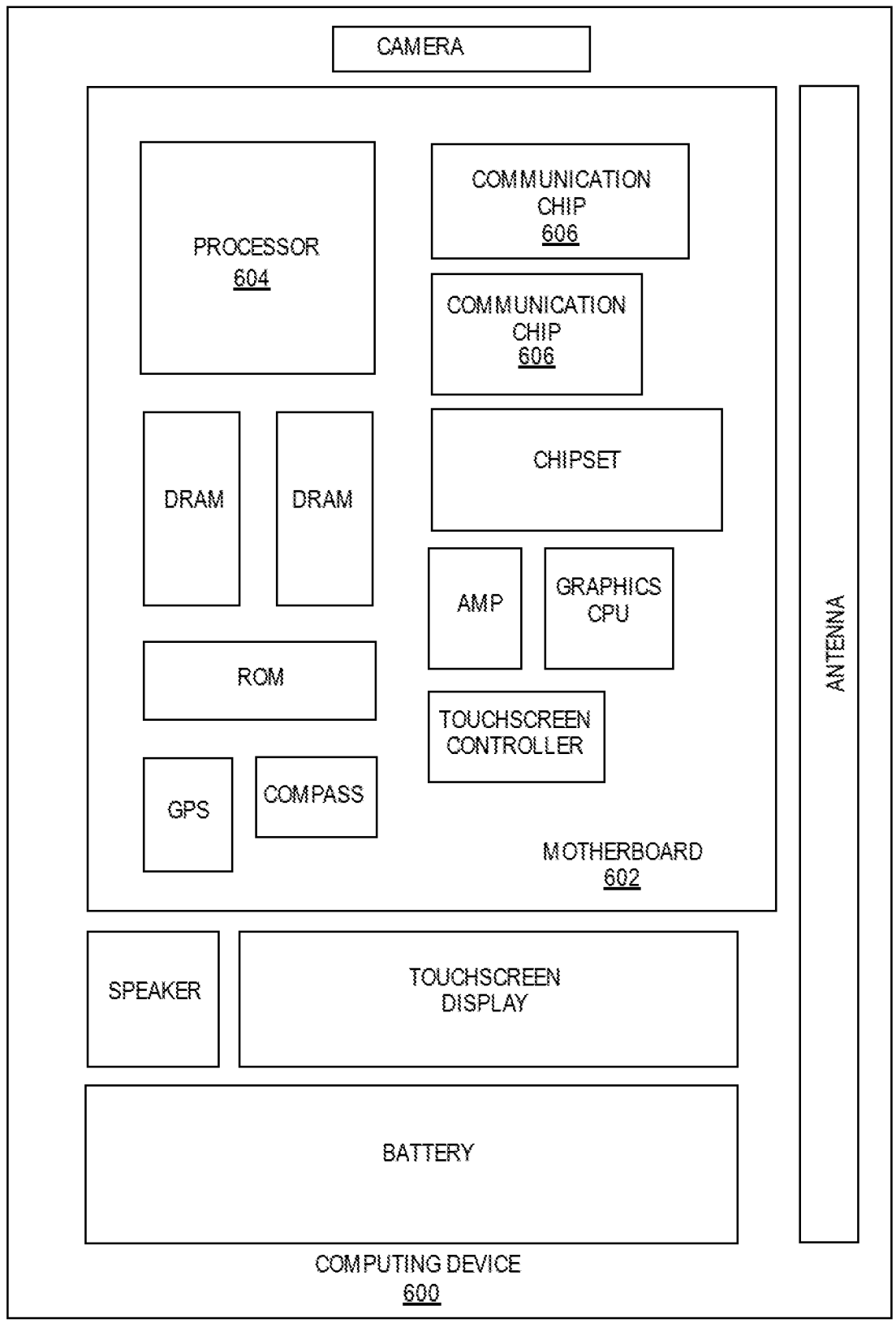
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor 604 may comprise an extended drain nanoribbon transistor, as described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip 606 may comprise an extended drain nanoribbon transistor, as described herein.

In further implementations, another component housed within the computing device 600 may comprise an extended drain nanoribbon transistor, as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
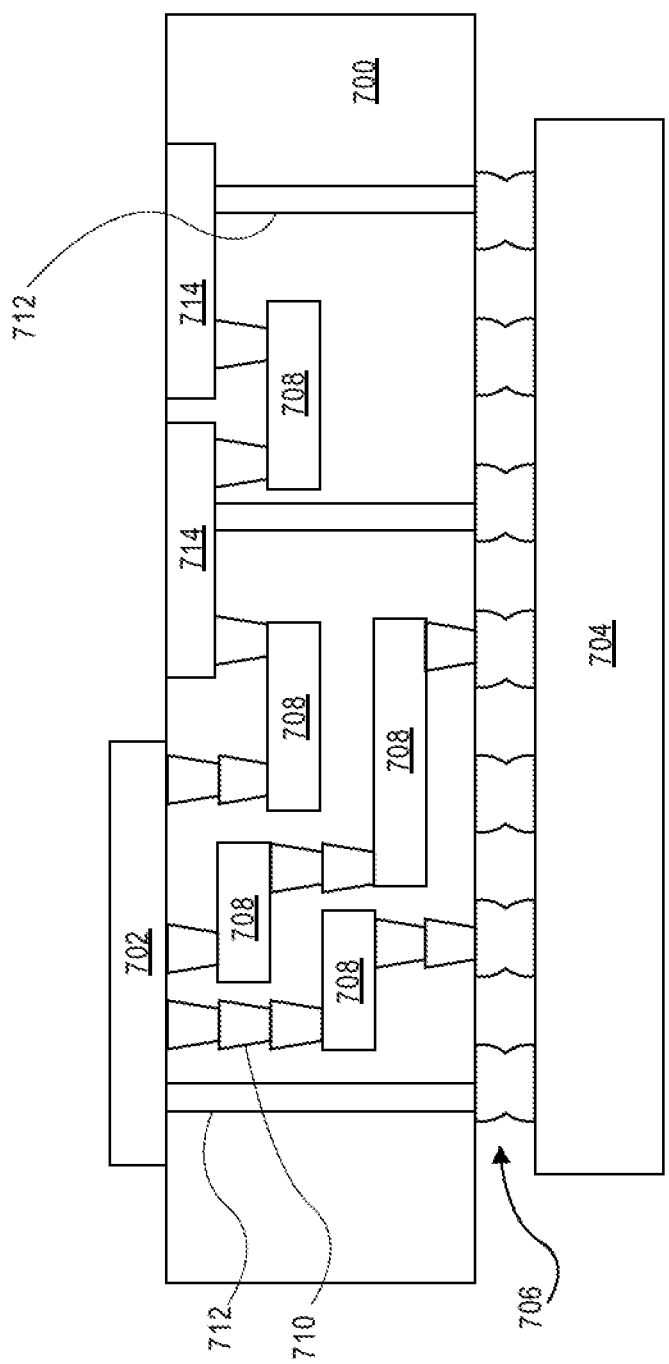
FIG. 7 is an interposer implementing one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. In an embodiment, one of both of the first substrate 702 and the second substrate 704 may comprise an extended drain nanoribbon transistor, in accordance with embodiments described herein. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments of the present disclosure may comprise semiconductor devices that comprise an extended drain nanoribbon transistor, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a substrate; a source region over the substrate; a drain region over the substrate; a semiconductor body extending from the source region to the drain region, wherein the semiconductor body has a first region with a first conductivity type and a second region with a second conductivity type; and a gate structure over the first region of the semiconductor body, wherein the gate structure is closer to the source region than the drain region.

Example 2: the semiconductor device of Example 1, wherein the source region and the drain region have the second conductivity type, and wherein the drain region has a first dopant concentration and the second region of the semiconductor body has a second dopant concentration that is less than the first dopant concentration.

Example 3: the semiconductor device of Example 2, wherein the first dopant concentration is approximately $10^{18}$ cm$^{-3}$ or greater, and wherein the second dopant concentration is approximately $10^{18}$ cm$^{-3}$ or less.

Example 4: the semiconductor device of Examples 1-3, wherein the second region of the semiconductor body extends into the gate structure.

Example 5: the semiconductor device of Examples 1-4, wherein a length of the second region of the semiconductor body is greater than a length of first region of the semiconductor body.

Example 6: the semiconductor device of Examples 1-5, wherein the gate structure comprises a gate dielectric, wherein the gate dielectric is over part of the first region of the semiconductor body and over part of the second region of the semiconductor body.

Example 7: the semiconductor device of Examples 1-6, further comprising: a first dummy gate structure over the second region of the semiconductor body, wherein the first dummy gate structure is closer to the drain region than the source region.

Example 8: the semiconductor device of Example 7, wherein a spacing between the gate structure and the first dummy gate structure is approximately equal to a length of the drain region.

Example 9: the semiconductor device of Example 7, further comprising: a second dummy gate structure over the second region of the semiconductor body, wherein the second dummy gate structure is substantially equidistant to the source region and the drain region.

Example 10: the semiconductor device of Examples 1-9, wherein the second region of the semiconductor body comprises a non-uniform dopant concentration along a length of the second region.

Example 11: the semiconductor device of Examples 1-10, wherein the semiconductor body is a nanowire or a nanoribbon.

Example 12: a semiconductor device comprising: a substrate; a source region over the substrate; a drain region over the substrate; a vertically oriented stack of semiconductor bodies extending from the source region to the drain region, wherein the semiconductor bodies have a first length; and a gate structure adjacent to the source region and around the stack of semiconductor bodies, wherein the gate structure has a second length that is smaller than the first length.

Example 13: the semiconductor device of Example 12, wherein the gate structure defines a channel region of the semiconductor bodies.

Example 14: the semiconductor device of Example 13, wherein the semiconductor bodies are surrounded by a gate dielectric only within the channel region.

Example 15: the semiconductor device of Examples 12-14, wherein the drain region comprises: a main body; and a plurality of protrusions extending towards the source region.

Example 16: the semiconductor device of Example 15, further comprising: a dummy source/drain region adjacent to the gate structure, wherein the dummy source/drain region comprises: a dummy body; and a plurality of dummy protrusions extending towards the drain region.

Example 17: the semiconductor device of Examples 12-16, wherein the semiconductor bodies comprise a drain extension.

Example 18: the semiconductor device of Example 17, wherein the drain extension has a first dopant concentration and the drain region has a second dopant concentration that is greater than the first dopant concentration.

Example 19: the semiconductor device of Example 17 or Example 18, wherein the drain extension is partially surrounded by the gate structure.

Example 20: the semiconductor device of Examples 12-19, wherein the semiconductor bodies are nanowires or nanoribbons.

Example 21: a method of forming a semiconductor device, comprising: forming a fin, wherein the fin comprises alternating semiconductor bodies and sacrificial layers; disposing a sacrificial gate structure over the fin; removing the sacrificial layers outside of the sacrificial gate structure; disposing a mask layer over a portion of the fin adjacent to the sacrificial gate structure; forming a source region and a drain region on opposite ends of the fin; removing the sacrificial gate structure and the mask layer; removing the remaining portions of the sacrificial layers; doping a region of the semiconductor bodies; and disposing a gate structure over the portion of the semiconductor bodies previously covered by the sacrificial gate structure.

Example 22: the method of Example 21, wherein doping the region of the semiconductor bodies is implemented before disposing the sacrificial gate structure.

Example 23: the method of Example 21 or Example 22, wherein the drain region is spaced away from the gate structure by a distance equal to twice a length of the drain region.

Example 24: an electronic device, comprising: a board; an electronic package electrically coupled to the board; and a die electrically coupled to the electronic package, wherein the die comprises: a substrate; a source region over the substrate; a drain region over the substrate; a semiconductor body extending from the source region to the drain region, wherein the semiconductor body has a first region with a first conductivity type and a second region with a second conductivity type; a gate structure over the first region of the semiconductor body, wherein the gate structure is closer to the source region than the drain region.

Example 25: the electronic device of Example 24, wherein the source region and the drain region have the second conductivity type, and wherein the drain region has a first dopant concentration and the second region of the semiconductor body has a second dopant concentration that is less than the first dopant concentration.

What is claimed is:

1. A semiconductor device, comprising:
a substrate;
a source region over the substrate;
a drain region over the substrate;
a semiconductor body extending from the source region to the drain region, wherein the semiconductor body has a first region with a first conductivity type and a second region with a second conductivity type;
a gate structure vertically surrounding the first region of the semiconductor body, wherein the gate structure is closer to the source region than the drain region;
a dummy gate structure over the second region of the semiconductor body, wherein the dummy gate structure is closer to the drain region than the source region;
an isolation structure laterally between the gate structure and the dummy gate structure, the isolation structure having an uppermost surface at a same level as an uppermost surface of the gate structure and an uppermost surface of the dummy gate structure; and
a gate spacer laterally between the dummy gate structure and the isolation structure, the gate spacer separate and distinct from the isolation structure.

2. The semiconductor device of claim 1, wherein the source region and the drain region have the second conductivity type, and wherein the drain region has a first dopant concentration and the second region of the semiconductor body has a second dopant concentration that is less than the first dopant concentration.

3. The semiconductor device of claim 2, wherein the first dopant concentration is approximately $10^{18}$ m$^{-3}$ or greater, and wherein the second dopant concentration is approximately $10^{18}$ cm$^{-3}$ or less.

4. The semiconductor device of claim 1, wherein the second region of the semiconductor body extends into the gate structure.

5. The semiconductor device of claim 1, wherein a length of the second region of the semiconductor body is greater than a length of first region of the semiconductor body.

6. The semiconductor device of claim 1, wherein the gate structure comprises a gate dielectric, wherein the gate dielectric is over part of the first region of the semiconductor body and over part of the second region of the semiconductor body.

7. The semiconductor device of claim 1, wherein a spacing between the gate structure and the first dummy gate structure is approximately equal to a length of the drain region.

8. The semiconductor device of claim 1, further comprising:
a second dummy gate structure over the second region of the semiconductor body, wherein the second dummy gate structure is substantially equidistant to the source region and the drain region.

9. The semiconductor device of claim 1, wherein the second region of the semiconductor body comprises a non-uniform dopant concentration along a length of the second region.

10. The semiconductor device of claim 1, wherein the semiconductor body is a nanowire or a nanoribbon.

11. A semiconductor device comprising:
a substrate;
a source region over the substrate;
a drain region over the substrate;
a vertically oriented stack of semiconductor bodies extending from the source region to the drain region, wherein the semiconductor bodies have a first length;
a gate structure adjacent to the source region and vertically surrounding the stack of semiconductor bodies, wherein the gate structure has a second length that is smaller than the first length;

a dummy gate structure vertically surrounding the stack of semiconductor bodies, the, wherein the dummy gate structure is closer to the drain region than the source region;

an isolation structure laterally between the gate structure and the dummy gate structure, the isolation structure having an uppermost surface at a same level as an uppermost surface of the gate structure and an uppermost surface of the dummy gate structure; and a gate spacer laterally between the dummy gate structure and the isolation structure, the gate spacer separate and distinct from the isolation structure.

12. The semiconductor device of claim 11, wherein the gate structure defines a channel region of the semiconductor bodies.

13. The semiconductor device of claim 12, wherein the semiconductor bodies are surrounded by a gate dielectric only within the channel region.

14. The semiconductor device of claim 11, wherein the drain region comprises:
a main body; and
a plurality of protrusions extending towards the source region.

15. The semiconductor device of claim 14, further comprising:
a dummy source/drain region adjacent to the gate structure, wherein the dummy source/drain region comprises:
a dummy body; and
a plurality of dummy protrusions extending towards the drain region.

16. The semiconductor device of claim 11, wherein the semiconductor bodies comprise a drain extension.

17. The semiconductor device of claim 16, wherein the drain extension has a first dopant concentration and the drain region has a second dopant concentration that is greater than the first dopant concentration.

18. The semiconductor device of claim 16, wherein the drain extension is partially surrounded by the gate structure.

19. The semiconductor device of claim 11, wherein the semiconductor bodies are nanowires or nanoribbons.

20. An electronic device, comprising:
a board;
an electronic package electrically coupled to the board; and
a die electrically coupled to the electronic package, wherein the die comprises:
a substrate;
a source region over the substrate;
a drain region over the substrate;
a semiconductor body extending from the source region to the drain region, wherein the semiconductor body has a first region with a first conductivity type and a second region with a second conductivity type;
a gate structure vertically surrounding the first region of the semiconductor body, wherein the gate structure is closer to the source region than the drain region;
a dummy gate structure over the second region of the semiconductor body, wherein the dummy gate structure is closer to the drain region than the source region;
an isolation structure laterally between the gate structure and the dummy gate structure, the isolation structure having an uppermost surface at a same level as an uppermost surface of the gate structure and an uppermost surface of the dummy gate structure; and
a gate spacer laterally between the dummy gate structure and the isolation structure, the gate spacer separate and distinct from the isolation structure.

21. The electronic device of claim 20, wherein the source region and the drain region have the second conductivity type, and wherein the drain region has a first dopant concentration and the second region of the semiconductor body has a second dopant concentration that is less than the first dopant concentration.

* * * * *